United States Patent
Masuda et al.

(10) Patent No.: US 11,174,350 B2
(45) Date of Patent: *Nov. 16, 2021

(54) RESIN AND PHOTOSENSITIVE RESIN COMPOSITION

(71) Applicant: TORAY INDUSTRIES, INC., Tokyo (JP)

(72) Inventors: Yuki Masuda, Otsu (JP); Yu Shoji, Otsu (JP); Kimio Isobe, Otsu (JP); Ryoji Okuda, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 591 days.

This patent is subject to a terminal disclaimer.

(21) Appl. No.: 15/765,596

(22) PCT Filed: Sep. 21, 2016

(86) PCT No.: PCT/JP2016/077828
§ 371 (c)(1),
(2) Date: Apr. 3, 2018

(87) PCT Pub. No.: WO2017/064984
PCT Pub. Date: Apr. 20, 2017

(65) Prior Publication Data
US 2019/0081258 A1    Mar. 14, 2019

(30) Foreign Application Priority Data

Oct. 16, 2015 (JP) .............................. JP2015-204251

(51) Int. Cl.
| | |
|---|---|
| C08G 73/10 | (2006.01) |
| G03F 7/20 | (2006.01) |
| C08L 79/08 | (2006.01) |
| C08K 5/13 | (2006.01) |
| G03F 7/075 | (2006.01) |
| H01L 51/05 | (2006.01) |

(52) U.S. Cl.
CPC .............. C08G 73/10 (2013.01); C08L 79/08 (2013.01); G03F 7/20 (2013.01); C08K 5/13 (2013.01); C08L 2203/16 (2013.01); C08L 2203/20 (2013.01); G03F 7/0751 (2013.01); G03F 7/2022 (2013.01); H01L 51/052 (2013.01)

(58) Field of Classification Search
CPC .......... G03F 7/037; C08G 73/10; C08G 79/08
See application file for complete search history.

(56) References Cited

U.S. PATENT DOCUMENTS

| | | | |
|---|---|---|---|
| 10,197,915 B2* | 2/2019 | Masuda | ................ G03F 7/0233 |
| 2012/0133061 A1* | 5/2012 | Mitsukura | .................. C09J 7/35 |
| | | | 257/798 |

FOREIGN PATENT DOCUMENTS

| | | | | |
|---|---|---|---|---|
| JP | 7-281192 A | | 10/1995 | |
| JP | 2002-88154 | * | 3/2002 | ............. C08G 73/14 |
| JP | 2010-9052 A | | 1/2010 | |
| JP | 2014-224855 A | | 12/2014 | |
| WO | WO 2014/199800 A1 | | 12/2014 | |

OTHER PUBLICATIONS

English Translation of JP 2002-88154 (Mar. 2002) (Year: 2002).*
International Search Report, issued in PCT/JP2016/077828, dated Oct. 25, 2016.
Written Opinion of the International Searching Authority, issued in PCT/JP2016/077828, dated Oct. 25, 2016.

* cited by examiner

Primary Examiner — Daborah Chacko-Davis
(74) Attorney, Agent, or Firm — Birch, Stewart, Kolasch & Birch, LLP

(57) ABSTRACT

A resin and a photosensitive resin composition whereby a cured film exhibiting high extensibility, reduced stress, and high adhesion to metals can be obtained are provided. A resin (A) including a polyamide structure and at least any structure of an imide precursor structure and an imide structure, wherein at least any of the structures of the resin (A) include a diamine residue having an aliphatic group.

3 Claims, 3 Drawing Sheets

RESIN AND PHOTOSENSITIVE RESIN COMPOSITION

TECHNICAL FIELD

The present invention relates to a resin and a photosensitive resin composition. More particularly, the present invention relates to a resin and a photosensitive resin composition which are suitably used for a surface protection film for a semiconductor device and the like, an interlayer dielectric film, and an insulating layer for an organic electroluminescent element.

BACKGROUND ART

Conventionally, polyimide-based resins and polybenzoxazole-based resins, which are excellent in heat resistance, electric insulation, and the like, have widely been used for a surface protection film or interlayer dielectric film for a semiconductor device, an insulating layer for an organic electroluminescent element, and a flattening film of a TFT substrate. Furthermore, photosensitive polyimides and photosensitive polybenzoxazoles to which photosensitivity is imparted have been studied to enhance the overall productivity.

In recent years, increasing the degree of multi-layering and increased thickness of insulating materials progresses in association with increasing the degree of integration of semiconductor devices and therefore curing at a low temperature and reducing stress are required in order to reduce a heat load onto a semiconductor device in a production process and to reduce stress against a substrate wafer. However, conventional materials have a drawback in that large warpage of a substrate material is generated due to large film shrinkage after heat curing.

Regarding this, a method of reducing the stress generated during forming a cured film to achieve reduction in stress in which a flexible alkyl group, alkylene glycol group, and/or siloxane bond is introduced into the repeating unit of an alkali-soluble cyclized polyimide has been proposed (Patent Literature 1). Cyclized polyimides having a flexible group are, however, susceptible to inferior in resistance in a reliability test such as an impact resistance test because of insufficient extensibility of a cyclized polyimide having a flexible group.

Additionally, as a method for reducing stress, a polybenzoxazole precursor having aliphatic group on dicarboxylic acid of a benzoxazole precursor is proposed (Patent Literature 2). Moreover, it is investigated that adhesion property is enhanced by copolymerization of benzoxazole with an imide structure (Patent Literature 3 to 5).

PRIOR ART DOCUMENTS

Patent Literatures

Patent Literature 1: JP-2012234030-A
Patent Literature 2: JP-008224984-A
Patent Literature 3: JP-2014084347-A
Patent Literature 4: JP-2013167743-A
Patent Literature 5: JP-4735778-B1

SUMMARY OF INVENTION

Problem to be Solved by the Invention

However, the benzoxazole precursor having an aliphatic-group only on dicarboxylic acid tended to reduce stress insufficiently because film shrinkage by cyclization is large and also exhibited insufficient adhesion to metals because it has no site to interact with a metal.

Moreover, when benzoxazole and an imide structure are copolymerized, there were some cases in which adhesion to metals after curing at a low temperature, the degree of reducing stress, and high extensibility were insufficient.

The present invention has been made in an effort to solve the problems of conventional art as described above, and provides a resin, and a photosensitive resin composition whereby a cured film exhibiting high extensibility, reduced stress, and high adhesion to metals can be obtained.

Means for Solving the Problems

In order to solve the above problems, the present invention relates to the following.

A resin (A) comprising a polyamide structure and at least any structure of an imide precursor structure and an imide structure, comprising a diamine residue having an aliphatic group in at least any of said structures of resin (A), and a photosensitive resin composition comprising the resin.

Effects of the Invention

The present invention provides a resin and a photosensitive resin composition whereby a cured film exhibiting high extensibility, reduced stress, and high adhesion to metals can be obtained.

MODE FOR CARRYING OUT INVENTION

Figure 1:
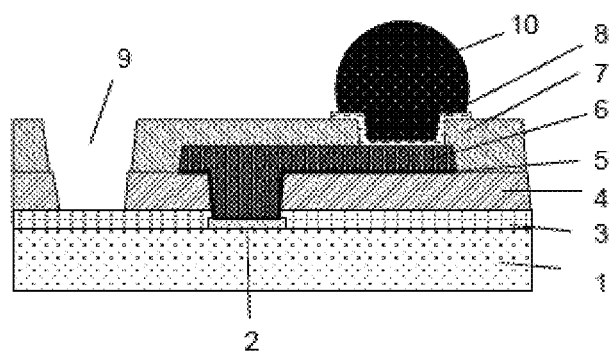
FIG. 1 depicts an enlarged cross-sectional view of a pad portion of a semiconductor device having a bump.

The resin according to the present invention is a resin (A) characterized by comprising a polyamide structure and at least any structure of an imide precursor structure and an imide structure, wherein at least any of the structures of the resin (A) comprise a diamine residue having an aliphatic group.

The polyamide structure of the resin according to the present invention is a benzoxazole precursor with two sets of amino group and hydroxyl group located in the ortho position to each other, other polyhydroxyamide, polyamide or a copolymerized structure thereof. In addition, the polyimide precursor structure of the resin according to the present invention is a polyamic acid, polyamic acid ester, or a structure in which a resin end and/or resin side chain is/are capped with an amic acid or amic acid ester. In addition, the polyimide structure of the resin according to the present invention is a structure in which a resin structure is capped with an imide.

Including at least any structure of an imide precursor structure and imide structure allows enhancing an interaction with a metal and adhesion to metals after forming a cured film more than in a case of a sole polyamide structure. In addition, in the present invention, a diamine residue having an aliphatic group is preferably included in at least any structure of the polyamide structure, an imide precursor structure and imide structure, and may be included in any one structure of them or all structures.

An aliphatic diamine residue has so high affinity with a metal that a resin with high adhesion property to a metal can be provided. In addition, an aliphatic diamine has so strong basic character that, by making it act as a ring-closing promoter in polymerization, high ring closure rate of imide skeleton is possible in a step having produced a polyamide resin. As a result, a ring closure rate can be lowered in heat-curing, so that it is possible to suppress shrinkage of the cured film and increasing stress generated thereby of the cured film. In other Words, reducing stress is possible. In addition, a flexible aliphatic diamine residue contributes to high extensibility of a polyamide, so that adhesion to metals is enhanced and a cured film with reduced stress and high extensibility can be obtained.

The resin of component (A) according to the present invention has a resin, in which the polyamide stricture is a structure of the general formula. (1) and the imide precursor structure and the imide structure include at least-one or more structures selected from structures of the general formulas (2) to (5).

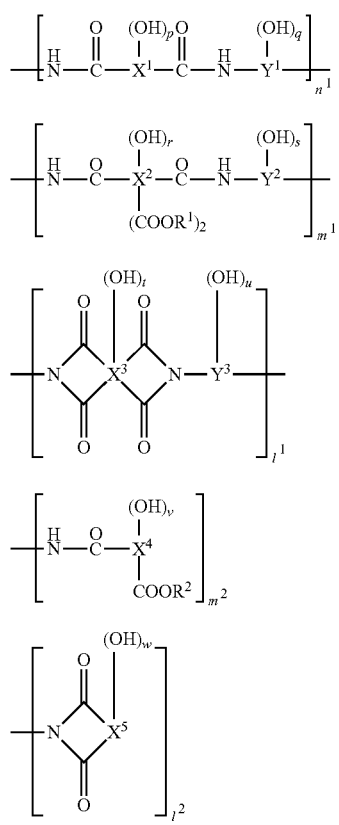

in the general formulas (1) to (5), $X^1$ represents a divalent to hexavalent organic group, $X^2$ and $X^3$ each, independently represent a tetravalent to decavalent organic group, $X^4$ represents a divalent to hexavalent organic group, $X^5$ represents a divalent to hexavalent organic group, $Y^1$ to $Y^3$ each independently represent a divalent to tetravalent organic group, and $R^1$ and $R^2$ represent hydrogen or an organic group having 1 to 20 carbon atoms; p, q, r, s, t, u, v, and w are each independently an integer number of 0 to 4; $n^1$, $m^1$, $m^2$, $l^1$, and $l^2$ represent molar ratio of a structure of the general formulas (1) to (5), and a range of $n^1:m^1+m^2+l^1+l^2=98:2$ to $5:95$; a sequence of structural units of the general formulas (1) to (5) may be in a block manner or in a random manner.

In the above general formula (1), $X^1$ represents a divalent to hexavalent organic group having two or more carbon atoms, and a structural component of an acid. $X^1$ is an aromatic dicarboxylic acid, such as terephthalic acid, isophthalic acid, diphenylether carboxylic acid, naphthalenedicarboxylic acid, or bis(carboxyphenyl)propane; an aliphatic dicarboxylic acid, such as cyclobutanedicarboxylic acid, cyclohexanedicarboxylic acid, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglitaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, octafluoroadipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, or diglycolic acid; a dicarboxylic acid having a structure of the following general formula; a tricarboxylic acid, such as trimellitic acid or trimesic acid; a compound having substitution of a part of hydrogen atoms of an aromatic ring and/or hydrocarbon thereof with an alkyl group, fluoroalkyl group having 1 to 10 carbon atoms, halogen atom and/or the like; or a structure derived from those which include a bond of —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, or —NHCONH—.

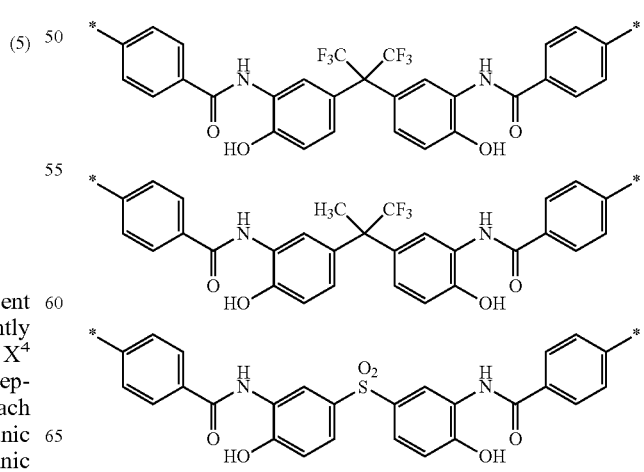

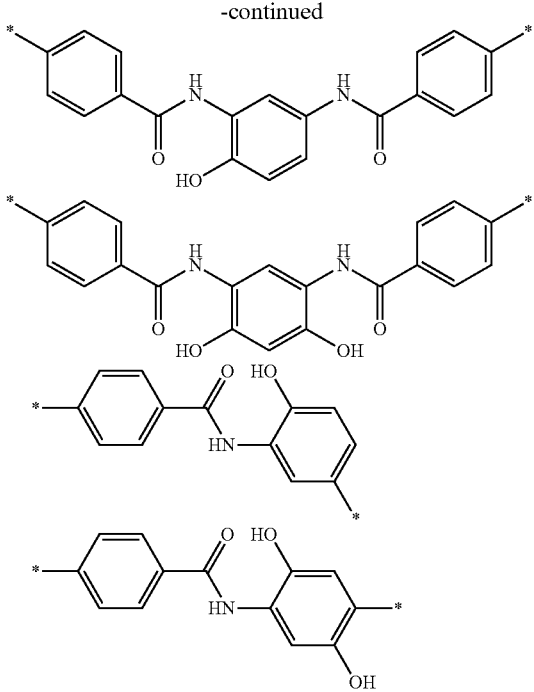

Among these, a structure derived from a dicarboxylic acid in which $X^1$ is aromatic is preferable for enhancing adhesion property because it is unlikely to undergo ring-closure in heat-curing, so that increasing stress by film shrinkage is suppressed.

For a production of the resin, when a condensation polymerization is carried out, for example, a compound in which a carboxylic acid of $X^1$ is substituted by an active carboxylic acid group of the following general formula is used.

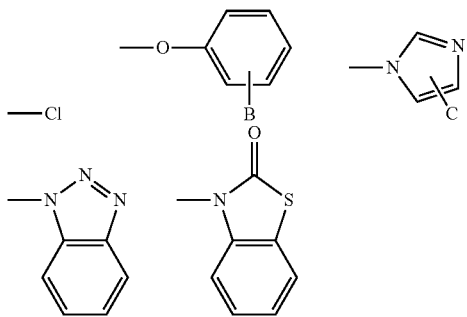

wherein B and C are, but not limited to, each independently a hydrogen atom, methyl group, ethyl group, propyl group, isopropyl group, t-butyl group, trifluoromethyl group, halogen group, phenoxy group, nitro group, or the like.

Among these, it is preferable an active carboxylic acid group other than chloride compounds be used. Use of an active carboxylic acid group other than chloride compounds allows reducing chloride ions in the obtained resin and preventing separation from a metallic substrate caused by the presence of chloride ions. In addition, it is more preferable that a diimidazolide compound be used as an active carboxylic acid group. A leaving group of a diimidazolide compound is a water soluble imidazole, so that it is possible to carry out reprecipitation and washing of obtained resin with water. Moreover, the leaved imidazole has basic character, so that it acts as a ring-closing promoter for a polyimide precursor structure in polymerization to allow a ring closure rate of imidation to be high in a step having produced a polyamide resin. As a result, a ring closure rate can be low when a cured film is formed by heat treatment.

$Y^1$ to $Y^3$ of the general formulas (1) to (3) represent divalent to tetravalent organic groups, and an organic group derived from a diamine.

It is preferable that $Y^1$ to $Y^3$ include a diamine residue having an aliphatic group. A diamine residue having an aliphatic group is preferable because of excellence in flexibility and stretchability, reduced modulus when formed into a cured film, and of the ability to impart reduced stress and high extensibility. In addition, a diamine residue having an aliphatic group not only easily interacts with a metal, but also is unlikely to experience separation between a cured film and a substrate caused by stress due to its flexible structure, so that it has high adhesion property to a metal.

The diamine including an aliphatic group in the resin according to the present invention has preferably at least any organic group of an alkyl group and alkyl ether group. Specifically, it is a diamine containing at least one selected from an alkyl group, cycloalkyl group, alkyl ether group and cycloalkyl ether group, a part of hydrogens of hydrocarbons of which may be substituted by an alkyl group(s) and/or fluoroalkyl group(s), having 1 to 10 carbon atoms, halogen atom(s), and/or the like, which optionally has a bond of —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like, and these organic group may also have an unsaturated bond and/or alicyclic structure.

In the present invention, when referred to as a diamine having an aliphatic group, it means a diamine which includes no siloxane structure. The reason is that, when a diamine have a siloxane structure, adhesion to a silicon substrate can be enhanced, but the effect of imparting high extensibility and high adhesion to metals, which is an object of the present invention, is low. In the present invention, when a siloxane structure is included for the purpose to enhance adhesion to a silicon substrate, the siloxane structure can be included in $Y^1$ to $Y^3$ of the general formulas (1) to (3) as described below.

Examples of the diamines having an aliphatic group include ethylenediamine, 1,3-diaminopropane, 2-methyl-1,3-propanediamine, 1,4-diaminobutane, 1,5-diaminopentane, 2-methyl-1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-cyclohexanediamine, 1,3-cyclohexanediamine, 1,4-cyclohexanediamine, 1,2-bis(aminomethyl)cyclohexane, 1,3-bis(aminomethyl)cyclohexane, 1,4-bis(aminomethyl)cyclohexane, 4,4'-methylene bis(cyclohexylamine), 4,4'-methylene bis(2-methylcyclohexylamine), 1,2-bis(2-aminoethoxy)ethane; and KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009, RT-1000, HE-1000, HT-1100, and HT-1700, (which are trade names; manufactured by HUNTSMAN Corporation), and further include the following compound, of which a part of hydrogens of an aromatic ring and/or a hydrocarbon is optionally substituted by an alkyl group(s), fluoroalkyl group(s) having 1 to 10 carbon atoms, a halogen atom(s) and/or the like and which optionally have a bond of —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like.

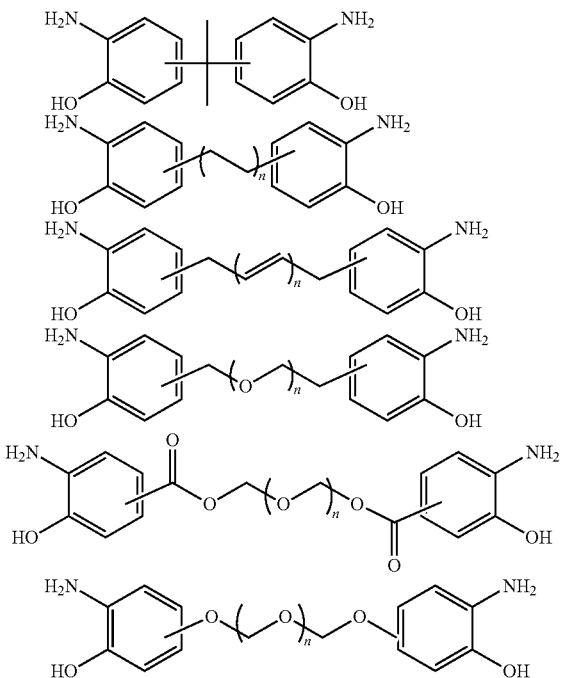

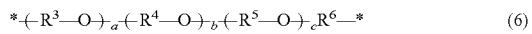

wherein n is an integer number of 1 to 20.

A diamine having an aliphatic group according to the present invention is an organic group having at least any one selected from an alkyl group and alkyl ether group, which is preferably an acyclic structure with a linear main chain, so that better flexibility and stretchability can be obtained and high extensibility can be achieved when formed into a cured film.

In addition, it is more preferable that a diamine residue having an aliphatic group have a structural unit of the general formula (6).

$$*\text{-}( R^3\text{---}O\text{-})_a\text{-}( R^4\text{---}O\text{-})_b\text{-}( R^5\text{---}O\text{-})_c R^6\text{---}* \quad (6)$$

in the general formula (6), R$^3$ to R$^6$ each independently represent a C$_2$-C$_{10}$ alkylene group; a, b, and c each are an integer number within a range of 1≤a≤0.20, 0≤b≤20, and 0≤c≤20; the sequence of repeating units is in a block manner or in a random manner; and * in the general formula (6) represents a chemical, bond.

In the structural unit of the general formula (6), due to the stretchability of the ether group, high extensibility can be imparted to a cured film when the cured film is formed. Moreover, the presence of the ether group allows complex formation with a metal and/or hydrogen bond formation, which provides high adhesion to metals.

Examples of the compounds including a structural unit of the general formula (6) include, but not limited to, 1,2-bis (2-aminoethoxy)ethane, KH-511, ED-600, ED-900, ED-2003, EDR-148, EDR-176, D-200, D-400, D-2000, THF-100, THF-140, THF-170, RE-600, RE-900, RE-2000, RP-405, RP-409, RP-2005, RP-2009; RT-1000, HE-1000, HT-1100, HT-1700, (which are trade names; manufactured by HUNTSMAN Corporation), and compounds of the following formulas, a part of hydrogen atoms of an aromatic ring and/or hydrocarbon of which is optionally substituted by an alkyl group(s), fluoroalkyl group(s) having 1 to 10 carbon atoms, halogen atoms(s) and/or the like, which optionally has a bond of —S—, —SO—, —SO$_2$—, —NH—, —NCH$_3$—, —N(CH$_2$CH$_3$)—, —N(CH$_2$CH$_2$CH$_3$)—, —N(CH(CH$_3$)$_2$)—, —COO—, —CONH—, —OCONH—, —NHCONH— or the like.

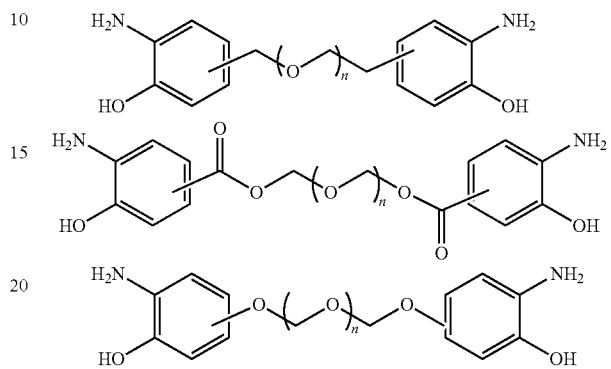

wherein n is an integer number of 1 to 20.

The number average molecular weight of the structural unit of the general formula (6) is preferably not less than 150 and not more than 2,000. The number average molecular weight of the structural unit of the general formula (6) is preferably not less than 150, more preferably not less than 600, still more preferably not less than 900 in order to impart flexibility and stretchability. Additionally, the number average molecular weight of the structural unit of the general formula (6) is preferably not more than 2,000, more preferably not more than 1,800, and still more preferably not more than 1,500 in order to enable to maintain solubility into an alkaline solution.

Moreover, among alkyl ethers, a tetramethylene ether group is preferable so excellent in heat resistance to enable to impart adhesion property to metals after reliability. Examples include, but not limited to, RT-1000, HE-1000, HT-1100, and HT-1700, (which are trade names; manufactured by HUNTSMAN Corporation), and the like.

In addition, it is preferable that a diamine having an aliphatic group have a structure without any phenolic hydroxyl group. Absence of any phenolic hydroxyl group allows suppressing shrinkage caused by ring-closure and dehydration and imparting low-stress property to a cured film.

Use of such a diamine having an aliphatic group allows imparting low-stress property, high extensibility, and high adhesion property to a metal to a cured film to be obtained maintaining solubility in alkaline solution.

The content of a diamine residue having an aliphatic group according to the present invention is preferably 5% to 40% by mole of all diamine residues. Effect of high adhesion to metals by diamine residue having an aliphatic group can be achieved when the content is 5% or more by mole, and highly reliable cured film can be obtained by preventing separation from a metallic substrate due to low hygroscopicity of the resin when the content is 40% or less by mole.

The sequence of repeating units of a diamine residue having an aliphatic group may be in a block manner or in a random manner, and it is preferable that it be included in a polyamide structure of the general formula (1) for the sake of enhancing extensibility in addition with possibility of imparting high adhesion property to a metal and low-stress property to a polyamide structure.

In addition, $Y^1$ to $Y^3$ of the general formulas (1) to (3) may be copolymerized with an aliphatic group having a siloxane structure in order to enhance adhesion property to a silicon substrate. Specific examples include those produced by 0.10 copolymerization with, as a diamine component, bis(3-aminopropyl)tetramethyldisiloxane, bis(p-aminophenyl)octamethylpentasiloxane, or the like in a ratio of 1% to 10% by mole.

It is preferable that $Y^1$ to $Y^3$ of the general formulas (1) to (3) further include a diamine residue having an aromatic ring. Including a diamine residue having an aromatic ring allows enhancing heat-resistance of a cured film to be obtained.

Specific examples of the diamines having an aromatic ring, but not limited to, aromatic diamines, such as bis(3-amino4-hydroxyphenyl)hexafluoropropane, bis(3-amino4-hydroxyphenyl)sulfone, bis(3-amino4-hydroxyphenyl)propane, bis(3-amino4-hydroxyphenyl)methylene, bis(3-amino4-hydroxyphenyl)ether, bis(3-amino4-hydroxy)biphenyl, 2,2'-ditrifluoromethyl-5,5'-dihydroxyl-4,4'-diaminobiphenyl, bis(3-amino4-hydroxyphenyl)fluorene, 2,2'-bis(trifluoromethyl)-5,5'-dihydroxybenzidine, and 3,4'-diaminodiphenyl ether, 4,4'-diaminodiphenyl ether, 3,4'-diaminodiphenylmethane, 4,4'-diaminodiphenylmethane, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminiophenoxy)phenyl} ether, 1,4-bis(4-aminophenoxy)benzene, 2,2'-dimethyl4,4'-diaminobiphenyl, 2,2'-diethyl4,4'-diaminobiphenyl, 3,3'-dimethyl4,4'-diaminobiphenyl, 3,3'-diethyl4,4'-diaminobiphenyl, 2,2',3,3'-tetramethyl4,4'-diaminobiphenyl, 3,3',4,4'-tetramethyl4,4'-diaminobiphenyl, and 2,2'-bis(trifluoromethyl)-4,4'-diaminobiphenyl, a part of hydrogen atoms of an aromatic ring and/or hydrocarbon of which is substituted by an alkyl group and/or fluoroalkyl group having 1 to 10 carbon atoms, and/or halogen atom, and also a diamine having the following structure. Other diamines to be copolymerized can be used directly or as corresponding diisocyanate compounds or trimethylsilylated diamines. Moreover, these two or more diamine components may be used in combination.

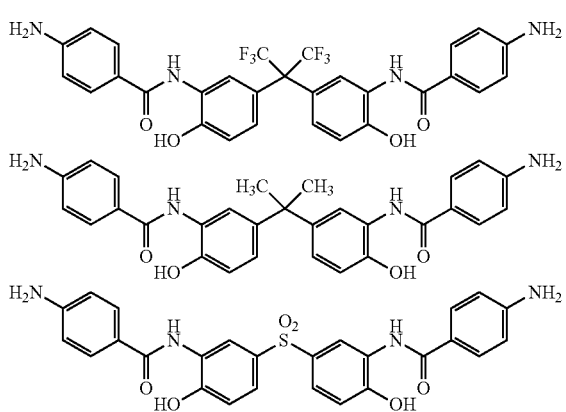

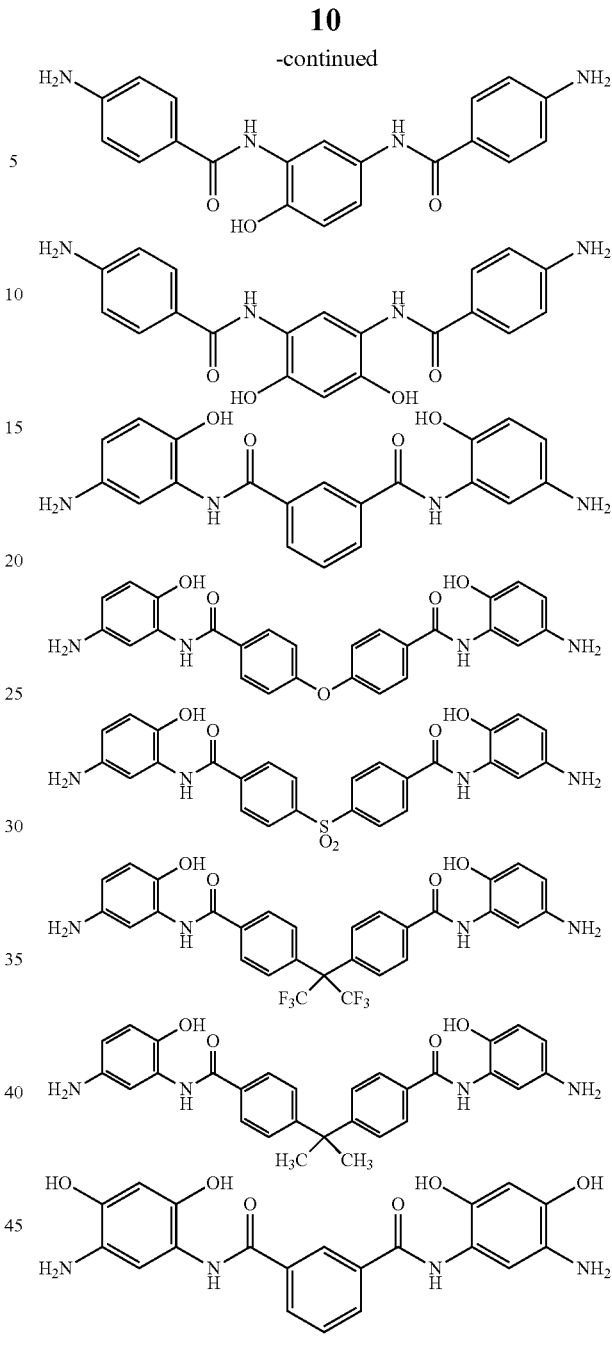

In the above general formula, (2) which is a polyimide precursor structure and the general formula (3) which is a polyimide structure, $X^2$ to $X^3$ each represent an acid dianhydride residue and is a tetravalent to decavalent organic group.

Specific examples of said acid anhydrides include, but not limited to, aromatic tetracarboxylic acid dianhydrides, such as pyromellitic dianhydride, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)

methane dianhydride, bis(2,3-dicarboxyphenyl)methane dianhydride, bis(3,4-dicarboxyphenyl)sulfone dianhydride, bis(3,4-dicarboxyphenyl) ether dianhydride, 1,2,5,6-naphthalenetetracarboxylic acid dianhydride, 9,9-bis(3,4-dicarboxyphenyl)fluorenic acid dianhydride, 9,9-bis {4-(3,4-dicarboxyphenoxy)phenyl}fluorenic acid dianhydride, 2,3,6,7-naphthalenetetracarboxylic acid dianhydride, 2,3,5,6-pyridinetetracarboxylic acid dianhydride, 3,4,9,10-perylenetetracarboxylic acid dianhydride, and 2,2-bis(3,4-dicarboxyphenyl)hexafluoropropane dianhydride; 3,3',4,4'-diphenylsulfonetetracarboxylic acid dianhydride, 1,2,3,4-cyclobutanetetracarboxylic acid dianhydride, 1,2,3,4-cyclopentanetetracarboxylic acid dianhydride, 1,2,4,5-cyclohexanetetracarboxylic acid dianhydride, 3,4-dicarboxy-1,2,3,4-tetrahydro-1-naphthalenesuccinic dianhydride, 5-(2,5-dioxotetrahydrofuryl)-3-methyl-3-cyclohexene-1,2-dicarboxylic acid dianhydride, 2,3,5-tricarboxy-2-cyclopentaneacetic dianhydride, bicyclo[2.2.2]oct-7-en-2,3,5,6-tetracarboxylic acid dianhydride, 2,3,4,5-tetrahydrofurantetracarboxylic acid dianhydride, 3,5,6-tricarboxy-2-norbornaneacetic dianhydride, 1,3,3a,4,5,9b-hexahydro-5-(tetrahydro-2,5-dioxo-3-furanyl)naphtho[1,2-c]furan-1,3-dione and acid dianhydride having a structure of the following formula and compounds of which a part of hydrogens of an aromatic ring and/or hydrocarbon is substituted by an alkyl group(s) and/or fluoroalkyl group(s) having 1 to 10 carbon atoms and/or a halogen atom(s).

netetracarboxylic acid dianhydride, 1,2,4,5-cyclohexanetetracarboxylic dianhydride, and 1,3,3a,4,5,9b-hexahydro-5(tetrahydro-2,5-dioxo-3-furanyl)naphtho[1,2-c]fran-1,3-dione are preferable. These are used solely or in any combination of two kinds or more thereof.

In the above general formula (4) which is a imide precursor structure and the general formula (5) which is a imide structure, $X^4$ to $X^5$ each is a dicarboxylic acid or acid anhydride residue and represents a structure in which a resin end and/or resin side chain is capped with an amic acid, amic acid ester or an imide.

Specific examples include, but not limited to, acid anhydrides, such as phthalic anhydride, maleic anhydride, nadic anhydride, cyclohexane dicarboxylic anhydride, and 3-hydroxyphthalic anhydride; dicarboxylic acids, such as phthalic acid, maleic acid, nadic acid, cyclohexane dicarboxylic acid, 3-hydroxyphthalic acid, 5-norbornene-2,3-dicarboxylic acid; tricarboxylic acids, such as trimellitic acid, trimesic acid, and diphenyl ether tricarboxylic acid; active ester compounds produced by a reaction one carboxyl group of dicarboxylic acids, such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene, with N-hydroxybenzotriazole, imidazole, or N-hydroxy-5-norbornene-2,3-dicarboximide, and compounds, of which a part of hydrogens of an aromatic ring and/or a hydrocarbon is

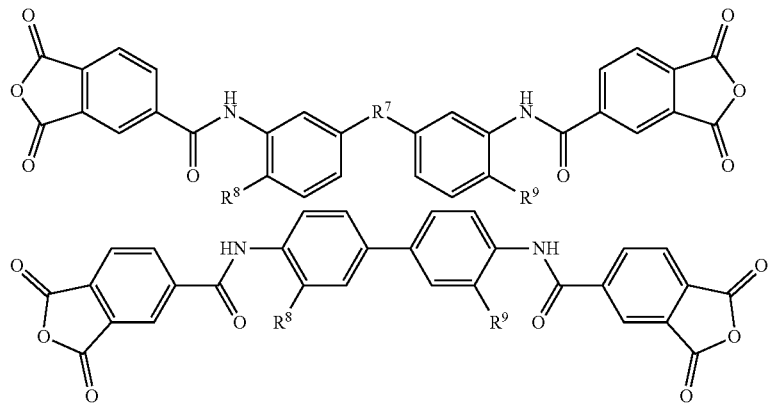

$R^7$ represents an oxygen atom, $C(CF_3)_2$, $C(CH_3)_2$ or $SO_2$, and $R^8$ and $R^9$ represent a hydrogen atom, hydroxyl group or thiol group.

Among these, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl) sulfone dianhydride, bis(3,4-dicarboxyphenyl) ether dianhydride, 2,2-bis(3,4-dicarboxyphenyl)hexafluoropropane dianhydride, 3,3',4,4'-diphenyl sulfone tetracarboxylic acid dianhydride, 9,9-bis (3,4-dicarboxyphenyl)fluorenic acid dianhydride, 9,9-bis{4-(3,4-dicarboxyphenoxy)phenyl}fluorenic acid dianhydride, butanetetracarboxylic acid dianhydride, 1,2,3,4-cyclopentasubstituted by an alkyl group(s) and/or a fluoroalkyl group(s), having 1 to 10 carbon atoms, and/or a halogen atom(s).

$R^1$ of the general formula (2) and $R^2$ of the general formula (4) each may be the same or different, and presents hydrogen or a monovalent organic group having 1 to 20 carbon atoms. It is preferable that each 10% by mole to 90% by mole of $R^1$ and $R^2$ be hydrogen from the viewpoints of solubility in an alkaline solution and solution stability of the photosensitive resin composition to be obtained. Moreover, it is more preferable that $R^1$ and $R^2$ each include at least one or more monovalent hydrocarbon group having 1 to 16 carbon atoms and that the other is hydrogen.

In addition, it is preferable that the imide precursor structure and imide structure according to the present invention have a structure of the general formula (3) which is a polyimide structure in order to suppress alteration of a ring closure rate in heat-curing and to achieve the effect of low-stress property. Resin ends have more sites to contact with other components and a substrate than the resin main chain, so that they enhance adhesion to extend the pot life of the resin composition. Therefore, it is preferable that the imide precursor structure and imide structure according to the present invention have a structure of the general formula (4) or (5) and it is more preferable that the above general formula (2) which is a polyimide precursor structure and the general formula (3) which is a polyimide structure exist near the end of the resin composition. This allows enhancing adhesion to further extend the pot life of the resin composition. For the purpose, it is preferable that the polyamide structure be polymerized, followed by copolymerization with at least any structure of an imide precursor structure and imide structure.

In addition, in order to obtain a cured film exhibiting high extensibility, reduced stress, and high adhesion to metals, a molar ratio of a structure of the general formula (1) and structures of the general formulas (2) to (5) is preferably $n^1:m^1+m^2+l^1+l^2=0.98:2$ to 5:95, more preferably 98:2 to 50:50, still more preferably 90:10 to 75:25.

In the present invention, $n^1$, $m^1$, $m^2$, $l^1$, and $l^2$ represent a molar ratio of structures of the general formulas (1) to (5) and can be confirmed by a method in which they are calculated based on a molar ratio of monomers used in polymerization, or by a method in which peaks of a polyamide structure, imide precursor structure and imide structure from an obtained resin, photosensitive resin composition and cured film are detected using nuclear magnetic resonance spectroscopy (NMR).

The weight average molecular weight of the resin according to the present invention is preferably 3,000 to 200,000. In this range, appropriate solubility of a resin in an alkaline solution is obtained, so that a high contrast between exposed and unexposed portions can be obtained to form a desired pattern. From the viewpoint of solubility of a resin in an alkaline solution, the weight average molecular weight of the resin is more preferably 100,000, more preferably not more than 50,000. Moreover, it is preferably 1.0000 or more from the viewpoint of enhancing extensibility. Here, the molecular weight can be measured by gel permeation chromatography (GPC) and obtained by converting the data based on a calibration curve from standard polystyrene.

In order to enhance pot life of the photosensitive resin composition according to the present invention, the ends of a main chain of a polyamide resin may be capped by the other end cap compound such as a monoamine, monocarboxylic acid, and monoactive ester compounds other than of the general formulas (4) and (5).

Moreover, by capping the ends of resin with an end cap compound that has a hydroxyl group, carboxyl group, sulfonic acid group, thiol group, vinyl group, ethynyl group, or allyl group, a dissolution rate of the resin in an alkaline solution and mechanical properties of the resulting cured film can be easily adjusted to within a preferable range.

The proportion of the end cap compound to be introduced is preferably not less than 0.1% by mole, more preferably not less than 5% by mole based on the total amine components in order to suppress decreasing in the solubility in an alkaline solution due to increased weight average molecular weight of polyamide resin. Additionally, it is preferably not more than 60% by mole, more preferably not more than 50% by mole in order to suppress lowering mechanical properties of the resulting cured film due to the decreased weight average molecular weight of polyamide resin. A plural of different end groups may be introduced by allowing a plural of end cap compounds to react.

Specifically, as an amine for an end cap compound, M-600, M-1000, M-2005, and M-2070 (which are trade names; manufactured by HUNTSMAN Corporation), and aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, and the like can be used. Two or more of them may be used in combination.

As a monocarboxylic acids and an active monoester compound for an end cap compound, monocarboxylic acids and active ester compounds of which a carboxyl group is esterified, such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid and 4-carboxybenzenesulfonic acid, and the like can be used. Two or more of them may be used in combination.

The end cap compound which is used in accordance with the present invention can be easily detected by the following methods. For example, the end cap compound that is used in accordance with the present invention can be easily detected by dissolving a resin, into which the end cap compound has been introduced, in an acidic solution to allow the resin decompose into an amine component and an acid anhydride component which are the constitutional units of the resin, followed by gas chromatography (GC) and/or NMR. Apart from this, the components of the resin, into which the end cap compound, can also be easily detected by directly analyzing by thermal decomposition gas chromatography (PGC), infrared spectroscopy and $^{13}$C-NMR spectroscopy.

The resin (A) according to the present invention is synthesized, for example, but not limited to, by the following method.

First, a compound in which a dicarboxylic acid is substituted by an active carboxylic group, a diamine having an aliphatic group, and the other copolymerization component are dissolved in an organic solvent at room temperature, in some cases, at raised temperature, followed by heat polymerization. From the viewpoint of stability of a solution in a reaction, the order of dissolving is preferably to dissolve a diamine which is highly soluble in advance. Subsequently, an acid dianhydride, in some cases, and the other copolymerization component is/are added, and an acid as an end cap compound, or an acid anhydride is then added to polymerize them.

When a diamine having an aliphatic group is introduced, a reaction of a compound in which a dicarboxylic acid is substituted by an active carboxylic group with the diamine compound is preferably carried out at 70° C. to 200° C.

For a polyimide precursor structure of the general formula (2), and an imide precursor structure of the general formula (4), in the above-mentioned polymerization method, when it is a structure derived from an acid anhydride and is an amid acid ester, the structure can be obtained by reacting a carboxylic acid with an esterification agent after the above-mentioned polymerization.

A polyimide of the general formula (3), or an imide structure of the general formula (5) used in accordance with the present invention can be synthesized utilizing, for example, a method in which an imide precursor is obtained by using a method for producing a structure of the general formula (2) and (4), followed by polymerization at 70° C. to 200° C.; a method in which a imide ring of an imide precursor is all closed using a known imidation reaction; and also a method in which an imide structure is partially introduce by stopping an imidation reaction in the middle; and further a method in which an imide structure is partially introduced by mixing a cyclized imide polymer in which a imide ring of an imide precursor is all closed with the polyimide precursor.

Examples of organic solvents which are used for the polymerization of resins include, but not limited to, amides, such as N,N-dimethylformamide, N,N-dimethylacetamide, N-methyl-2-pyrrolidone, 1,3-dimethyl-2-imidazolidinone, N,N'-dimethylpropyleneurea, N,N-dimethylisobutyramide, and methoxy-N,N-dimethylpropionamide; cyclic esters, such as γ-butyrolactone, γ-valerolactone, δ-valerolactone, γ-caprolactone, ε-caprolactone, and α-methyl-γ-butyrolactone; carbonates, such as ethylene carbonate, and propylene carbonate; glycols, such as triethylene glycol; phenols, such as m-cresol and p-cresol; acetophenone, 1,3-dimethyl-2-imidazolidinone, sulfolane, dimethylsulfoxide, tetrahydrofuran, dimethylsulfoxide, propylene glycol monomethyl ether acetate, and ethyl lactate.

It is preferable that the resin (A) according to the present invention be isolated by addition into plenty of water or a mixture of methanol and water after polymerization by the above-mentioned method, filtration after precipitation, and then drying. A drying temperature is preferably 40° C. to 100° C., more preferably 50° C. to 80° C. This operation allows removing unreacted monomers and oligomeric components such as a dimer and a trimer to enhance film properties after heat-curing.

An imidation rate of a resin having a structure of the general formula (3) or (5) in accordance with the present invention is easily determined, for example, by the following method. An infrared absorption spectrum for a polymer is first measured, and the presence of absorption peaks of an imide structure arising from a polyimide (around 1780 cm$^{-1}$, and around 1377 cm$^{-1}$) is confirmed. Next, an imidation rate of a sample wherein the polymer has been heat-treated at 350° C. for an hour is measured as a 100% sample by infrared absorption spectroscopy, the content of an imide group before heat-treatment is calculated by comparison of around 1377 cm$^{-1}$ peak strengths of the resin between before and after heat-treatment to determine the imidation rate. In order to suppress alteration of a ring closure rate in heat-curing and to achieve the effect of low-stress property, an imidation rate is preferably not less than 50%, more preferably not less than 80%.

The resin obtained by the method according to the present invention can be used as a photosensitive resin composition. The resin composition including the resin obtained by the method according to the present invention and a photo acid generator as a photosensitizer can be used as a positive-working photosensitive resin composition (a positive-working photosensitive varnish). In addition, the resin composition including the resin obtained by the method according to the present invention and a photopolymerizable compound as a photosensitizer can be used as a negative-working photosensitive resin composition (a negative-working photosensitive varnish).

A positive-working photosensitive composition is more suitable for use of forming a fine working pattern because of more excellent resolution than that of negative-working photosensitive resin composition.

A quinonediazide compound is preferably used as a photo acid generator for positive-working photosensitive resin composition. Examples of the quinonediazide compounds include a polyhydroxy compound that ester-bonded to a sulfonic acid group of a quinonediazide, a polyamino compound sulfonamide-bonded to a sulfonic acid group of a quinonediazide, a polyhydroxypolyamino compound ester-bonded and/or sulfonamide-bonded to a sulfonic acid group of a quinonediazide. Not all the functional groups of the polyhydroxy compound, polyamino compound, and polyhydroxypolyamino compound may be substituted by quinonediazide, but not less than 40% by mole of the total functional groups on average are preferably substituted by quinonediazide. By using such a quinonediazide compound, a positive photosensitive resin composition, which is sensitive to i-line (wavelength: 365 nm), h-line (wavelength: 405 nm), and g-line (wavelength 436 nm) radiation from a mercury lamp which is general ultraviolet rays, can be obtained.

Specific examples of the polyhydroxy compounds include, but not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, Methylene Tris-FR-CR, BisRS-26X, DML-MBPC, DML-MBOC, DML-OCHP, DML-PCHP, DML-PC, DML-PTBP, DML-34X, DML-EP, DML-POP, Dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TP-PHBA, and HML-TPHAP (which are trade names; manufactured by Honshu Chemical Industry Co., Ltd.); and BIR-OC, BIP-PC, BIR-PC, BIR-PTBP, BIR-PCHP, BIP-BIOC-F, 4PC, BIR-BIPC$_4$F, TEP-BIP-A, 46DMOC, 46DMOEP, and TM-BIP-A (which are trade names; manufactured by Asahi Organic Chemicals Industry Co., Ltd.); and 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylenebisphenol, BisP-AP (trade name; manufactured by Honshu Chemical Industry Co., Ltd.), novolac resins.

Specific examples of the polyamino compounds include, but not limited to, 1,4-phenylenediamine, 1,3-phenylenediamine, 4,4'-diaminodiphenyl ether, 4,4'-diaminodiphenylmethane, 4,4'-diaminodiphenylsulfone, 4,4'-diaminodiphenyl sulfide.

Moreover, specific examples of the polyhydroxypolyamino compounds include, but not limited to, 2,2-bis(3-amino-4-hydroxyphenyl)hexafluoropropane, 3,3'-dihydroxybenzidine.

Among these, it is preferable that the quinonediazide compound include an ester of a phenol compound and a 4-naphthoquinonediazide-sulfonyl group. This results in high sensitivity to i-line exposure and a higher resolution.

The content of the quinonediazide compound used for a photosensitive resin composition according to the present invention is preferably 1 to 50 parts by mass, more preferably 10 to 40 parts by mass based on 100 parts by mass of the resin. It can be contemplated that a higher level of sensitivity is achieved by specifying the content of the quinonediazide compound within this range to obtain higher contrast between exposed and unexposed portions, and it is furthermore preferable that no residue be not observed even when the content is increased. Furthermore, for example, a sensitizer can be added as needed.

The presence of a compound (D) of the general formula (7) described below in the photosensitive resin composition according to the present invention significantly enhances adhesion of a heat-cured film to a metal material, especially copper. This enhanced adhesion is attributed to the interaction of S atom and/or N atom in the compound of the general formula (7) with the metal surface, and furthermore to the conformation which promotes the interaction with the metal surface. These effects can impart photosensitivity to the resin composition, and afford a cured resin film having an excellent adhesion to a metal material even when the composition contains an additive. In the general formula (7), $R^7$ to $R^9$ represent any of an O atom, S atom, or N atom, and at least one of $R^7$ to $R^9$ represents a. S atom. l represents 0 or 1, and m and n represent an integer number of 0 to 2. $R^{10}$ to $R^{12}$ each independently represent a hydrogen atom or a $C_1$-$C_{20}$ organic group. Examples of $R^{10}$ to $R^{12}$ include a hydrogen atom, an alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, and combinations thereof, and may further have a substituent.

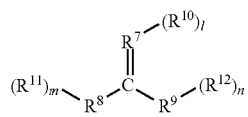
(7)

The addition amount of the compound of the general formula (7) is preferably 0.1 to 10 parts by weight based on the resin (A). When the addition amount is less than 0.1 parts by weight, it is difficult to obtain the effect of enhancing adhesion to a metal material, and when the addition amount is more than 10 parts by weight, the interaction with a photosensitizer may unfavorably reduce the sensitivity of the resin composition.

In the compound of the general formula (7) used in accordance with the present invention, $R^7$ to $R^9$ represent any of an O atom, S atom, or N atom, and at least one of $R^7$ to $R^9$ is preferably a S atom. In general, the composition to which a compound containing a N atom is added may have sensitivity impaired through the interaction between a photosensitizer and a compound containing a N atom, but when the compound contains a S atom, the interaction effect is suitably maintained, and the effect of enhancing adhesion can be obtained without lowering the sensitivity. Moreover, it is more preferable that a trialkoxymethyl group be contained from the viewpoint of the adhesion to substrates other than metals.

Examples of the compound of the general formula (7) include, but not limited to, the following structures.

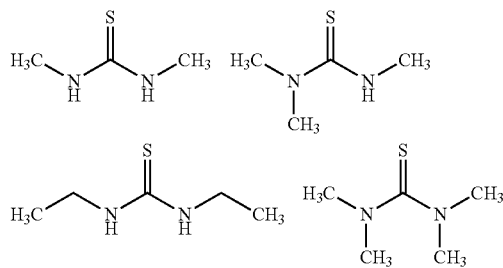

-continued

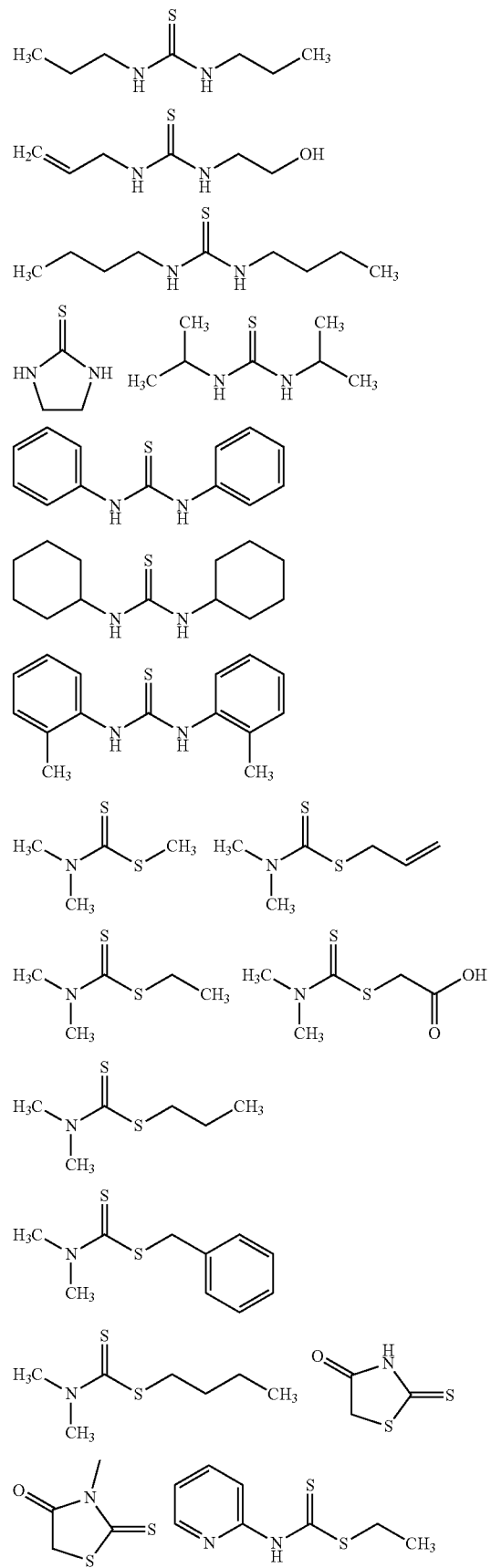

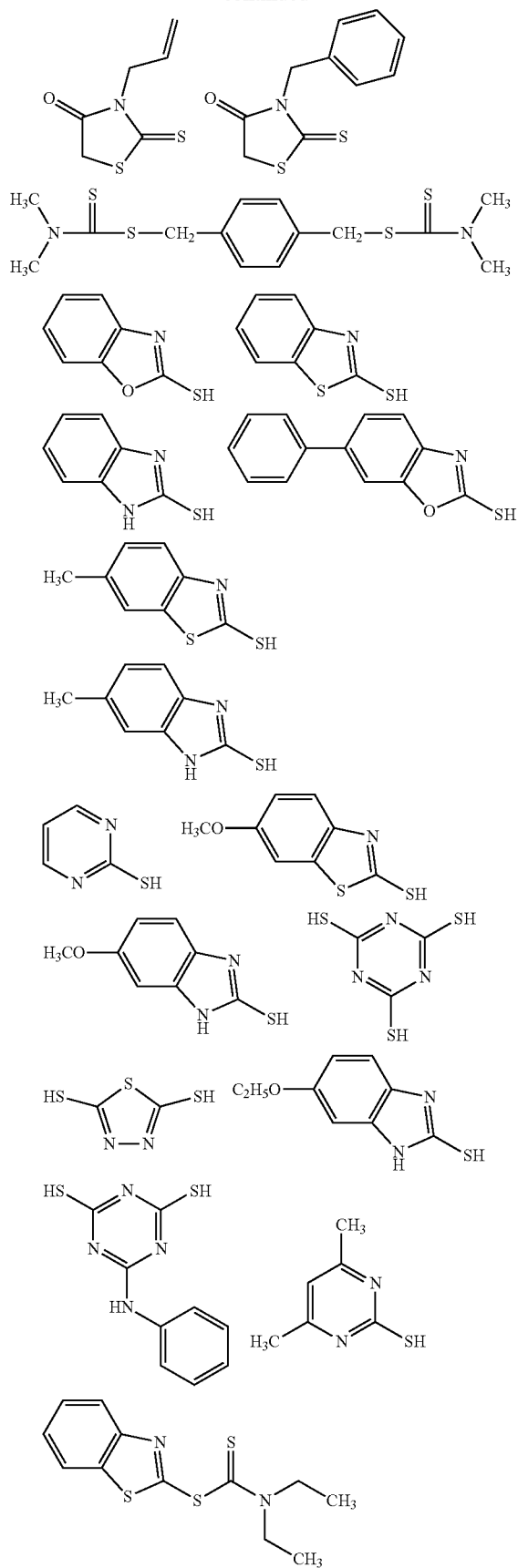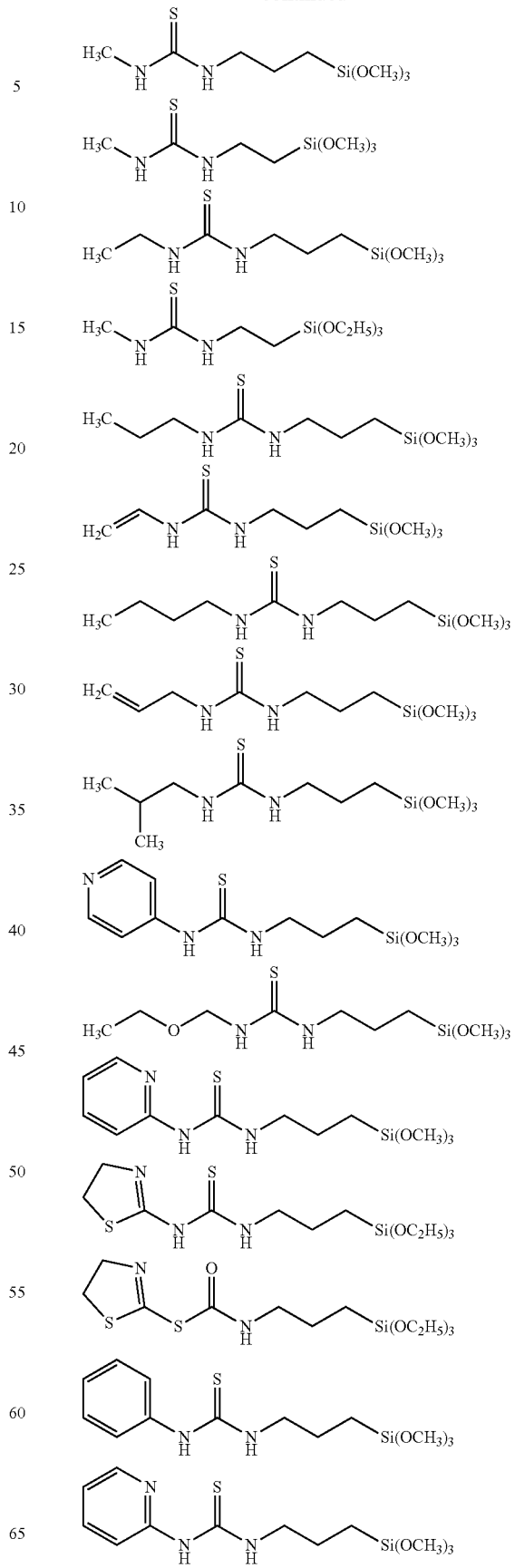

-continued

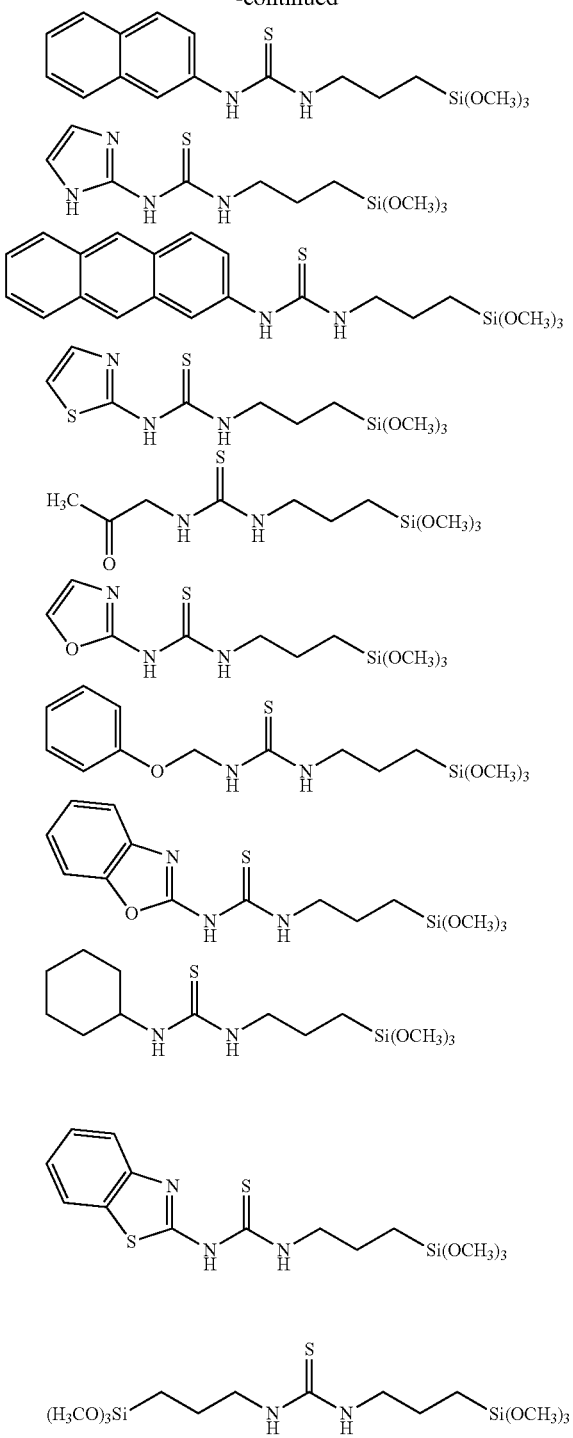

-continued

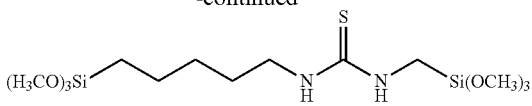

The presence of a compound (E) of the general formula (8) described below in the photosensitive resin composition according to the present invention significantly enhances extensibility property and adhesion to metallic material after curing after reliability test.

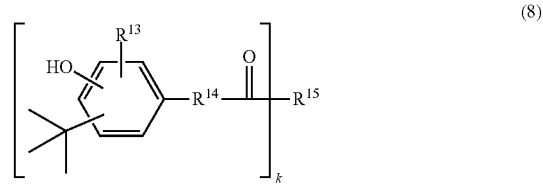

(8)

A compound of the general formula (8) works as an antioxidant to suppress oxidative degradation of the aliphatic group and phenolic hydroxyl group of the resin (A). Moreover, the rust preventing effect on metal materials can prevent oxidation of metal.

In the general formula (8), $R^{13}$ represents a hydrogen atom or an alkyl group having two or more carbon atoms; $R^{14}$ represents an alkylene group having two or more carbon atoms. $R^{15}$ represents an organic group having one to four valences and including at least any of an alkylene group containing two or more carbon atoms, O atom, and N atom. k represents an integer number of 1 to 4, and is preferably an integer number of 2 to 4 in order to enable action on both a resin (A) and a metallic material. Examples of $R^{15}$ include an alkyl group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, —O—, —NH—, —NHNH—, and any combinations thereof, and they optionally have a substituent. Among these, alkyl ether and —NH— are preferably included from the viewpoint of the solubility in a developer and the adhesion to metals; and —NH— is more preferably included from the viewpoint of the interaction with the resin (A) and the adhesion to metals by formation of the metal complex.

Examples of the compound of the general formula (8) include, but not limited to, the following structures.

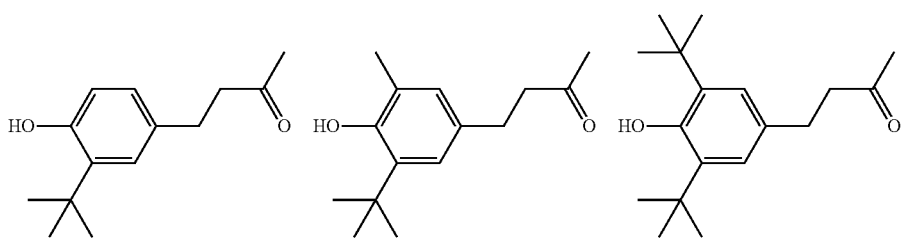

-continued
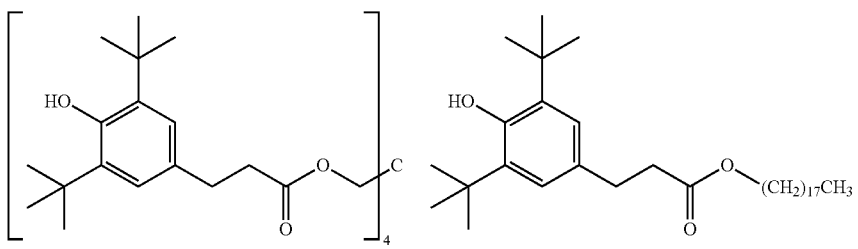
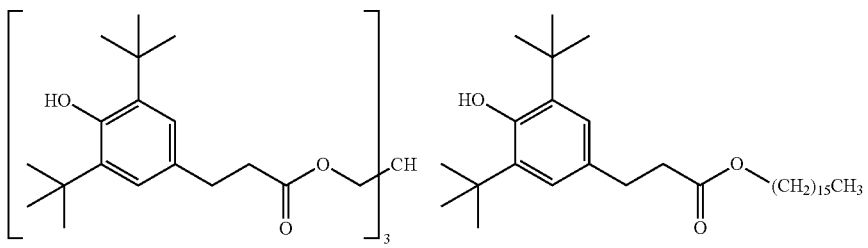
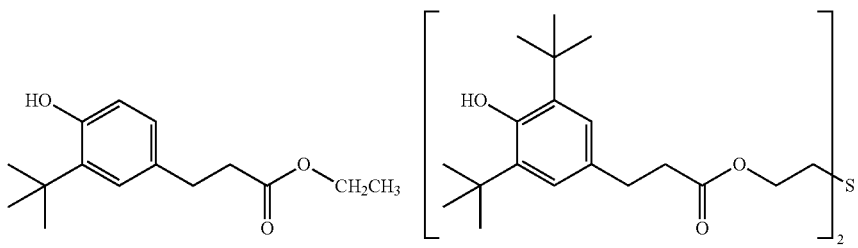
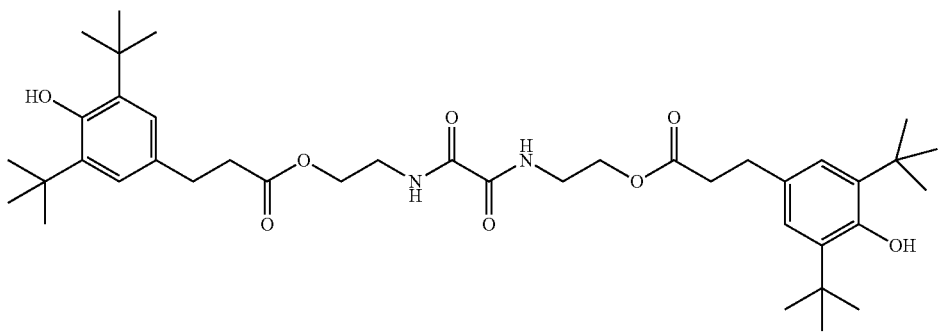
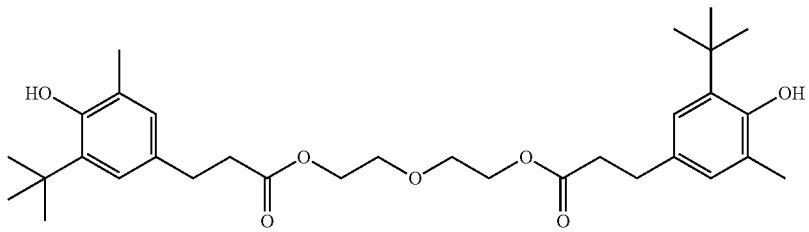
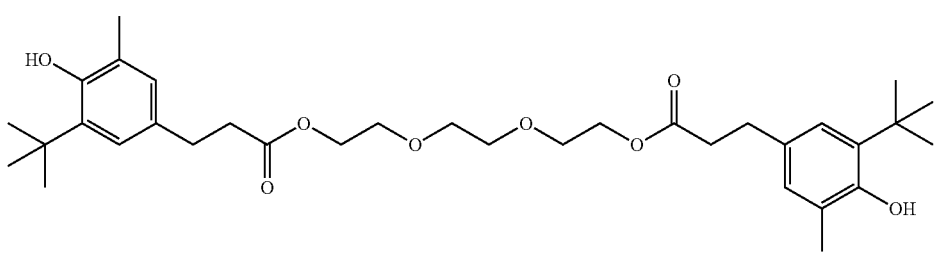

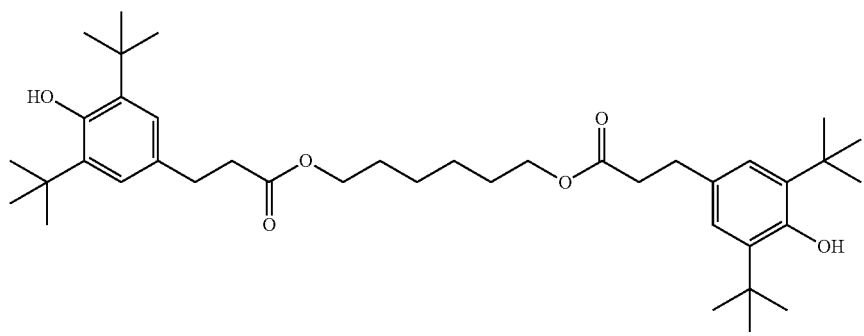
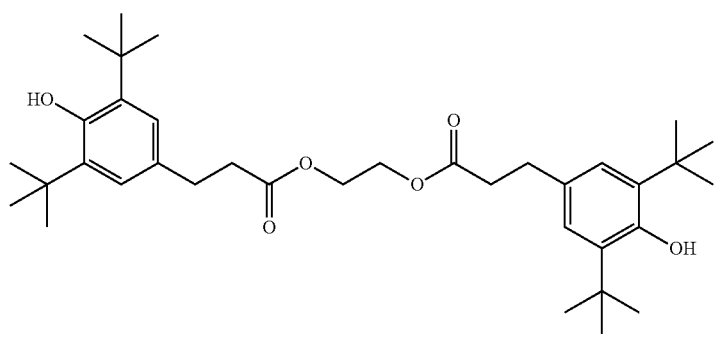
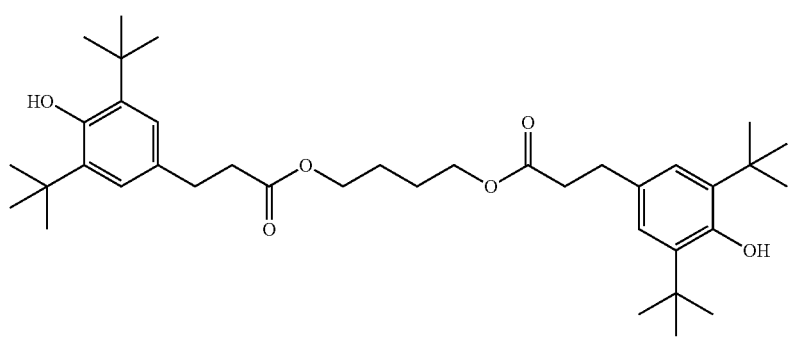
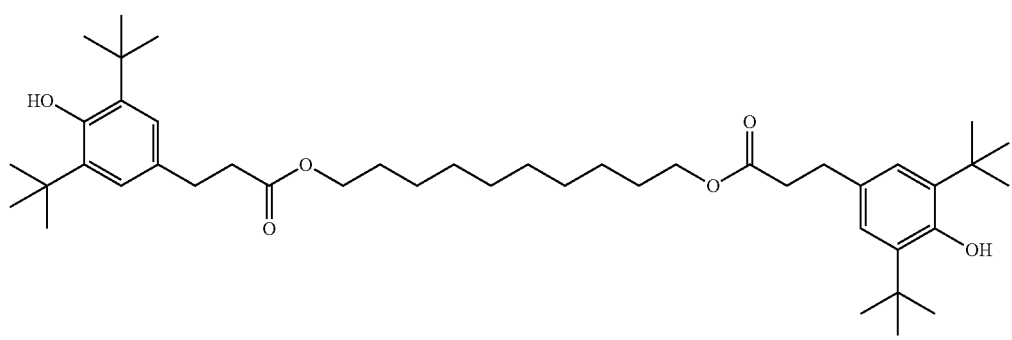
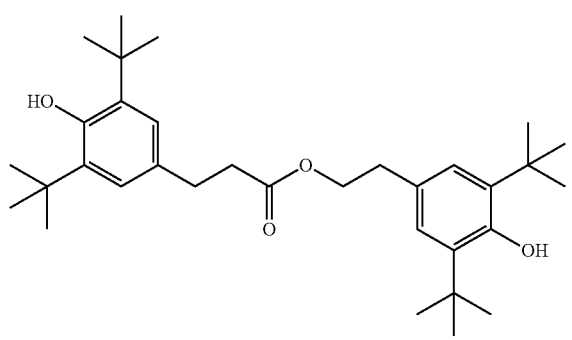

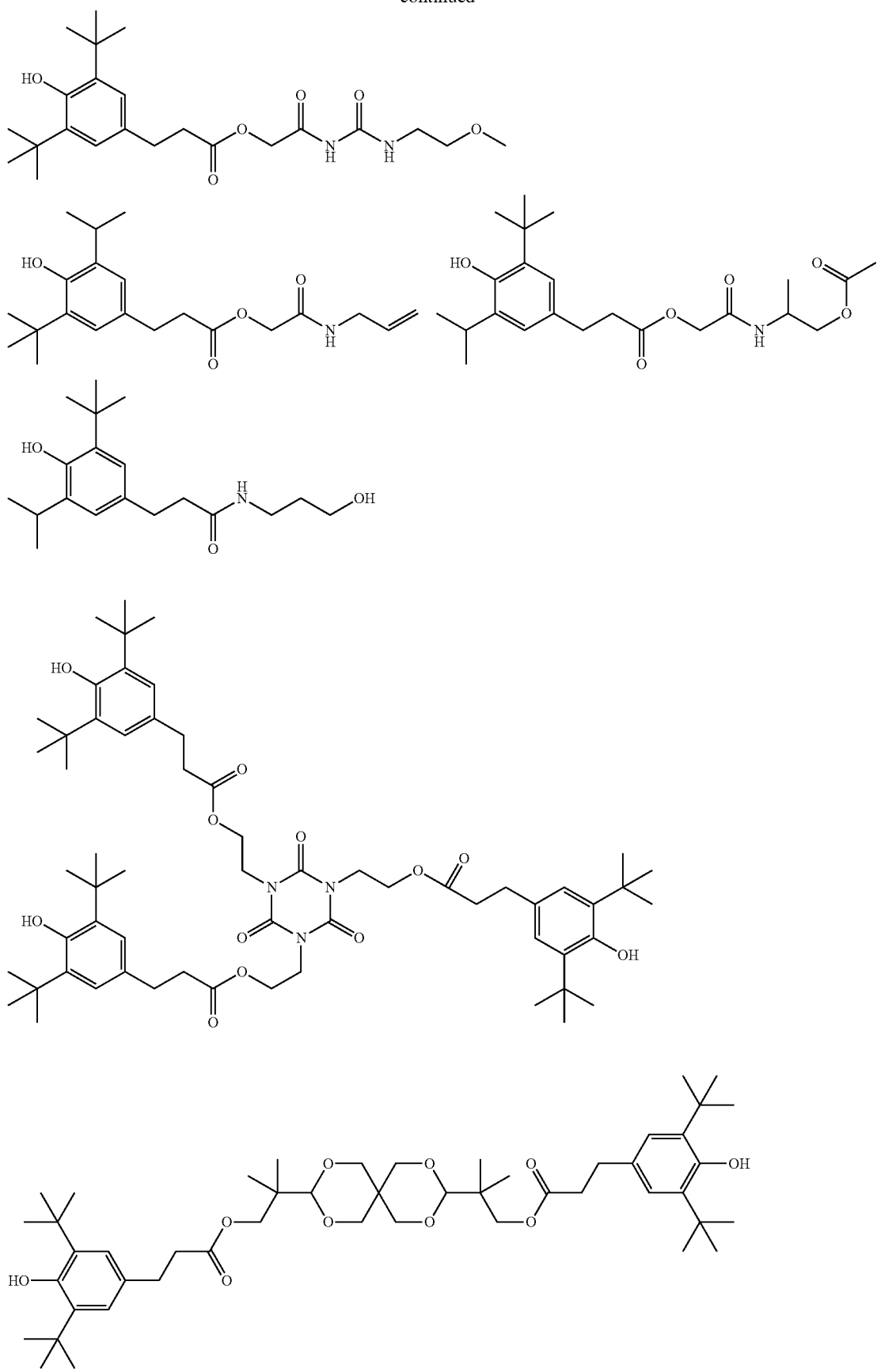

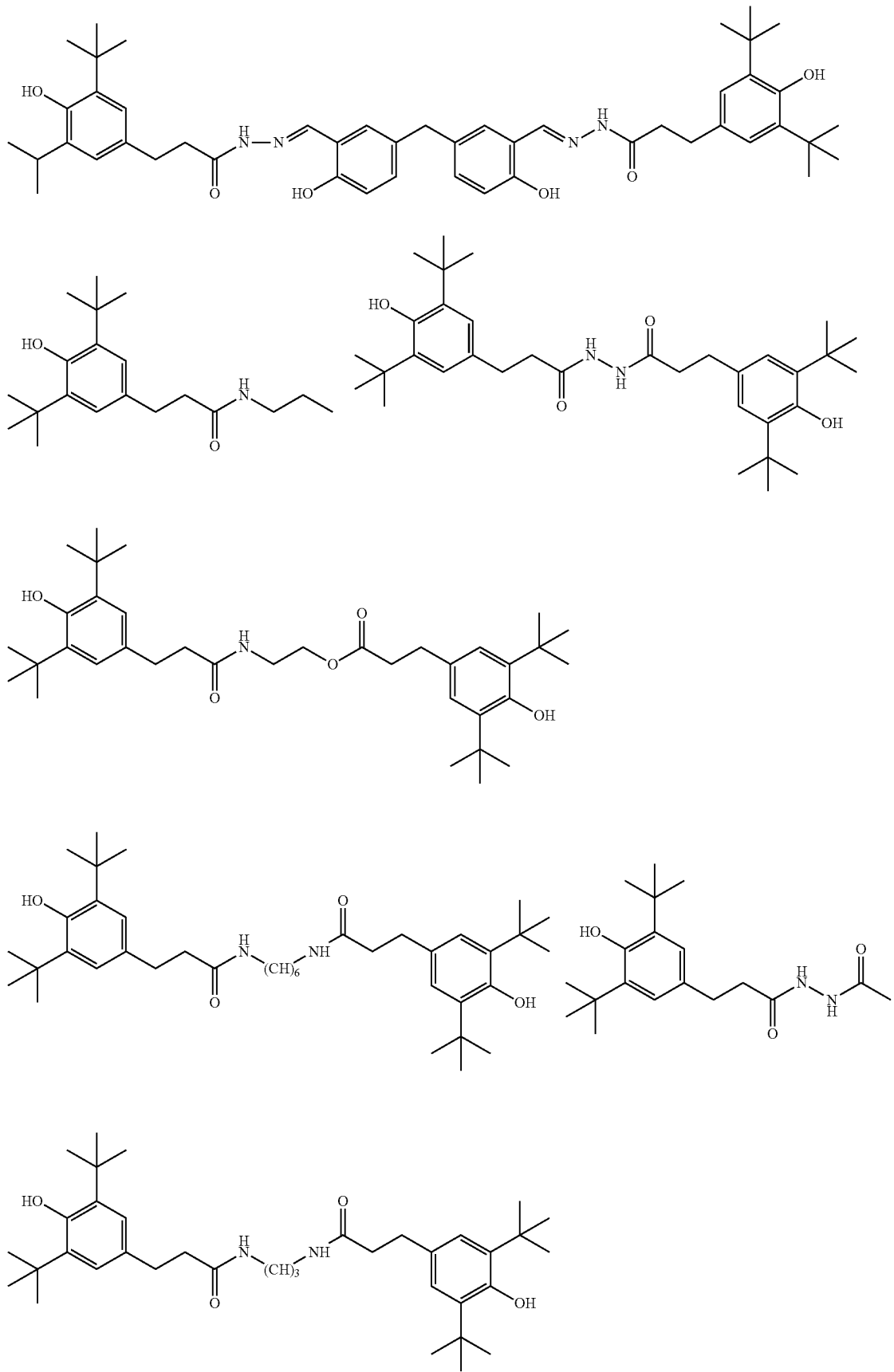

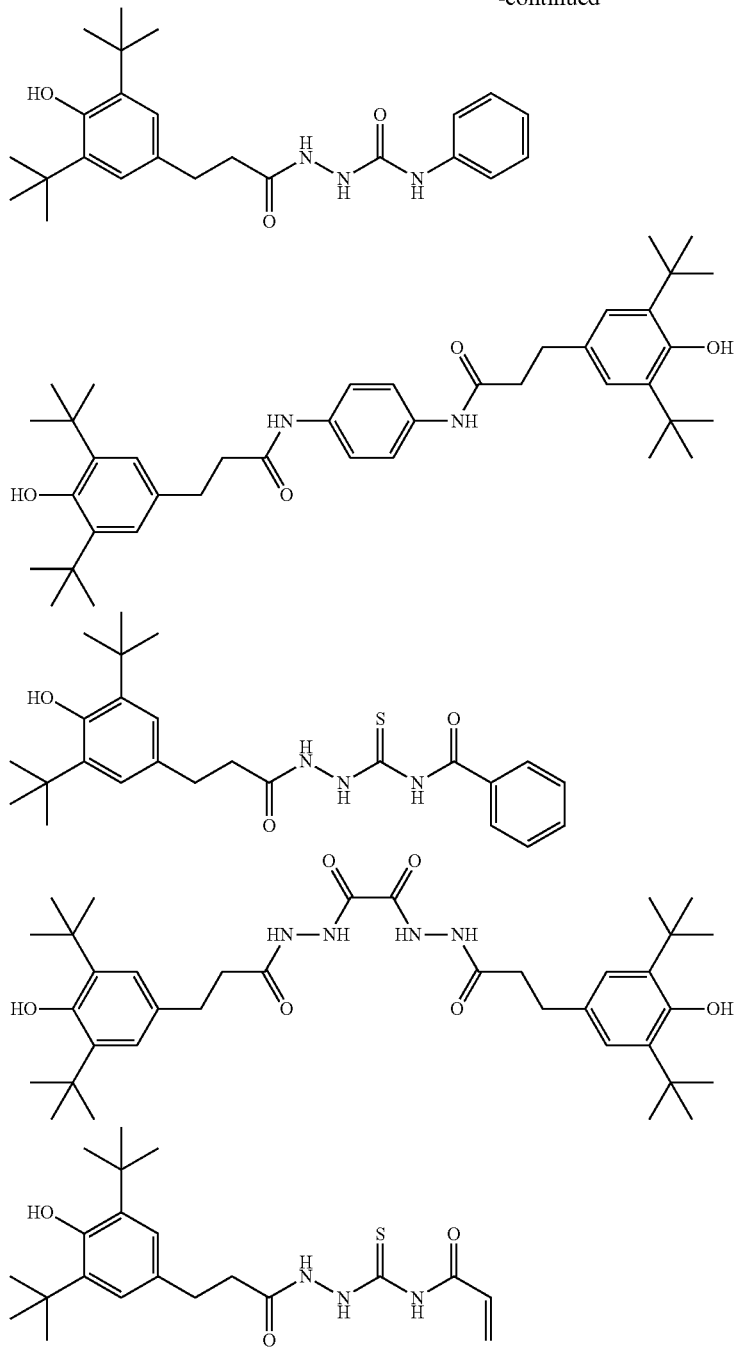

The addition amount of the compound of the general formula (8) is preferably 0.1 to 10 parts by weight, more preferably 0.5 to 5 parts by weight based on the resin (A). When the addition amount is less than 0.1 parts by weight, it is difficult to obtain extensibility property after reliability and the effect of enhancing adhesion to a metal material, and when the addition amount is more than 10 parts by weight, the interaction with a photosensitizer may unfavorably reduce the sensitivity of the resin composition.

The photosensitive resin composition according to the present invention includes a heat-crosslinker (F) having a structure unit of the following general formula (9), whereby it is possible to further enhance extensibility and reduce stress.

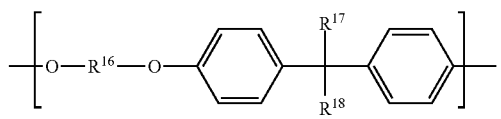

(9)

In the general formula (9), $R^{17}$ and $R^{18}$ each independently represent a hydrogen atom or methyl group. $R^{16}$ is a divalent organic group including an alkylene group having two or more carbon atoms, and may be linear, branched, or cyclic.

Examples of $R^{16}$ include an alkyl, group, cycloalkyl group, alkoxy group, alkyl ether group, alkylsilyl group, alkoxysilyl group, aryl group, aryl ether group, carboxyl group, carbonyl group, allyl group, vinyl group, heterocyclic group, and any combinations thereof, and they are optionally substituted.

It is possible to enhance extensibility and reduce stress exhibiting heat-resistance because a heat-crosslinker itself has a flexible alkylene group and rigid aromatic group. Examples of the crosslinking group include, but not-limited to, an acrylic group, methylol group, alkoxymethyl group, and epoxy group. Among these, an epoxy group is preferable from the viewpoints that it can react with a phenolic hydroxyl group of the resin (A) to improve heat resistance of a cured film and that it can react without dehydration.

Examples of the compound of the general formula (9) include, but not limited to, the following structures.

cured film after reliability test can be significantly enhanced. When the content is in this range, crosslinking of a heat-crosslinker having a structural unit of the general formula (9) is promoted in a cured film to suppress deterioration of an alkylene group after a reliability test.

The photosensitive resin composition according to the present invention may include a heat-crosslinker other than described above. Specifically, a compound having at least two of alkoxymethyl group and/or methylol group is preferable. The presence of at least these two groups can provide a cross-linked structure obtained through condensation of the resin and a homologous molecule. The combination with a photo acid generator or photopolymerization initiator allows a wider range of designs for improving the sensitivity and/or the mechanical properties of a cured film.

Preferred examples of such compounds include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DMLBisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-

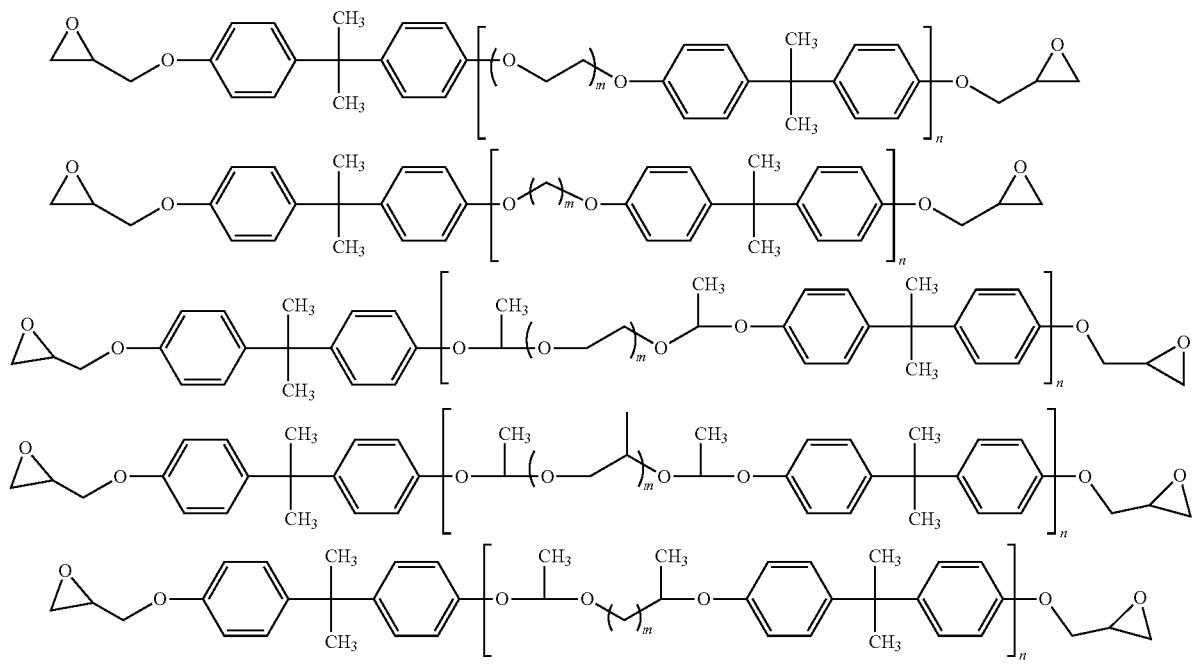

wherein n is an integer number of 1 to 5, and m is 1 to 20.

Among the structures described above, it is preferable that n be 1 to 2 and m be 3 to 7 from the viewpoint of enhancing both of heat resistance and extensibility.

The addition amount of the compound of the general formula (9) is preferably 2 to 35 parts by weight, more preferably 5 to 25 parts by weight based on the resin (A). When the addition amount is less than 5 parts by weight, it is difficult to obtain the effect of enhancing extensibility and reducing stress and, when the addition amount is more than 35 parts by weight, the sensitivity of the resin composition may be unfavorably reduced.

The content of the compound of the general formula (8) is in the range of 10 to 50 parts by weight based on 100 parts by weight of the heat-crosslinker having a structural unit of the general formula (9), whereby extensibility property of BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHIBA, HMOM-TPHAP (which are trade names, manufactured by Honshu Chemical Industry Co., Ltd.), NIKALAC (registered trademark) MX-290, and NIKALAC MX-280, NIKALAC MX-270, NIKALAC MX-279, NIKALAC MW-100LM, NIKALAC MX-750LM (which are trade names, manufactured by Sanwa Chemical Co., Ltd.). Two or more of these may be contained. Among those, HMOM-TPHAP and MW-100LM are more preferable because the addition of them will prevent reflow from occurring during curing and provide a high rectangular pattern.

Moreover, a low molecular weight compound having a phenolic hydroxyl group may be contained as necessary to the extent that the residual film rate after shrinkage during curing is not decreased. This allows the developing time to be shortened.

Examples of these compounds include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylene Fris-FR-CR, and BisRS-26X (which are trade names; Honshu Chemical Industry Co., Ltd.); and BIP-PC, BIR-PC, BIR-PTBP, and BIR-BIPC-F (which are trade names; manufactured by Asahi Organic Chemicals Industry Co., Ltd.); and the like. Two or more of these may be included.

The content of a low molecular weight compound having a phenolic hydroxyl group is preferably 1 to 40 parts by mass based on 100 parts by mass of the component (A).

The photosensitive resin composition according to the present invention preferably includes a solvent. Examples of the solvents include polar aprotic solvents, such as N-methyl-2-pyrrolidone, γ-butyrolactone, γ-valerolactone, δ-valerolactone, N,N-dimethylformamide, N,N-dimethylacetamide, dimethylsulfoxide, 1,3-dimethyl-2-imidazolidinone, N,N'-dimethylpropyleneurea, N,N-dimethylisobutyramide, and methoxy-N,N-dimethylpropionamide; ethers, such as tetrahydrofuran, dioxane, propylene glycol monomethyl ether, and propylene glycol monoethyl ether; ketones, such as acetone, methyl ethyl ketone, and diisobutyl ketone; esters, such as ethyl acetate, butyl acetate, isobutyl acetate, propyl acetate, propylene glycol monomethyl ether acetate, and 3-methyl-3-methoxybutyl acetate; alcohols, such as ethyl lactate, methyl lactate, diacetone alcohol, and 3-methyl-3-methoxybutanol; and aromatic hydrocarbons, such as toluene and xylene. Two or more of these may be contained.

The content of the solvent is preferably not less than 100 parts by mass based on 100 parts by mass of the component (A) in order to dissolve the composition, and preferably not more than 1,500 parts by mass in order to form a coating film having a thickness of 1 μm or more.

The photosensitive resin composition according to the present invention may include: surfactants; esters such as ethyl lactate and propylene glycol monomethyl ether acetate; alcohols such as ethanol; ketones such as cyclohexanone and methyl isobutyl ketone; and ethers such as tetrahydrofuran and dioxane for the purpose of improving wettability on a substrate.

In order to enhance adhesion to a substrate, the photosensitive resin composition according to the present invention may contain a silane coupling agent such as trimethoxyaminopropylsilane, trimethoxyepoxysilane, trimethoxyvinylsilane, or trimethoxythiolpropylsilane in an amount not imparing the pot life. The content of the silane coupling agent is preferably 0.01 to 5 parts by mass based on 100 parts by mass of the polyamide resin component.

The photosensitive resin composition according to the present invention preferably includes the other alkali-soluble resin. Specifical examples include a polyimide precursor, polyimide resin, polybenzoxazole, polybenzoxazole precursor, polyamide resin, siloxane resin, acrylic polymer copolymerized with acrylic acid, novolac resin, resole resin, polyhydroxystyrene resin, modified product thereof by introducing a crosslink group such as a methylol group, alkoxymethyl group and/or epoxy group, and copolymer thereof. Such resins are soluble in an alkaline solution such as tetramethylammonium hydroxide, choline, triethylamine, dimethylaminopyridine, monoethanolamine, diethylaminoethanol, sodium hydroxide, potassium hydroxide, sodium carbonate. The inclusion of these alkali-soluble resins can impart the properties of each alkali-soluble resin while maintaining the adhesion property and excellent sensitivity of the cured film.

Among these, taking account of possibility to reduce stress because of low change rate in shrinkage before and after curing in addition to the viewpoint of enhancing sensitivity, a novolac resin, resole resin, polyhydroxystyrene resin, or phenol resin such a modified product by introducing a crosslink group such as a methylol group, alkoxymethyl group, epoxy group, and the like thereto is preferable.

The content of these resin is preferably 5 to 200 parts by mass, more preferably 15 to 150 parts by mass based on 100 parts by mass of the resin (A) according to the present invention.

The resin composition according to the present invention may further include a dissolution modifying agent in a range that shrinkage rate after curing is not large. As a dissolution modifying agent, any compound, as long as it is a compound which is generally used as a dissolution modifying agent for a positive-working resist, such as a polyhydroxy compound, sulfonamide compound, urea compound, and the like, can be preferably used. Especially, a polyhydroxy compound which is a raw material for synthesizing quinonediazide is preferably used.

The photosensitive resin composition according to the present invention is a negative-working one which is insolubilized by light in case of formulating a photopolymerizable compound. A photopolymerizable compound includes a polymerizable unsaturated functional group. Examples of the polymerizable unsaturated functional groups include unsaturated double bond functional groups such as a vinyl group, allyl group, acryloyl group, and methacryloyl group, and unsaturated triple bond functional groups such as propargyl. Among these, a group, selected from conjugating type vinyl group, acryloyl group and methacryloyl group, is preferable from the viewpoint of polymerizability.

In addition, the number of the functional groups included is preferably 1 to 4 from the viewpoint of stability, and each group does not need to be the same. The number average molecular weight of the photopolymerizable compound is preferably 30 to 800. When the number average molecular weight is in a range of 30 to 800, it is compatible with a polyamide, and a solution of a resin composition is stable.

Preferable examples of photopolymerizable compounds include, for example, diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, styrene, α-methylstyrene, 1,2-dihydronaphthalene, 1,3-diisopropenylbenzene, 3-methylstyrene, 4-methylstyrene, 2-vinylnaphthalene, butyl acrylate, butyl methacrylate, isobutyl acrylate, hexyl acrylate, isooctyl acrylate, isobornyl acrylate, isobornyl methacrylate, cyclohexyl methacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol dimethacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, 2-hydroxyethyl acrylate, 2-hydroxyethyl methacrylate, 1,3-diacryloyloxy-2-hydroxypropane, 1,3-dimethacryloyloxy-2-hydroxypropane, methylenebisacrylamide, N,N- dimethylacrylamide, N-methylolacrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, N-vinylpyrrolidone, N-vinylcaprolactam. These are used solely or in any combination of two kinds or more.

Among these, 1,9-nonanediol dimethacrylate, 1,10-decanediol dimethacrylate, dimethylol-tricyclodecane diacrylate, isobornyl acrylate, isobornyl methacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, methylenebisacrylamide, N,N-dimethylacrylamide, N-methylolacrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, ethylene oxide-modified bisphenol A diacrylate, ethylene oxide-modified bisphenol A dimethacrylate, N-vinylpyrrolidone, N-vinylcaprolactam and the like can be especially preferably used.

The content of a photopolymerizable compound in the photosensitive resin composition according to the present invention is preferably 5 to 200 parts by mass based on 100 parts by mass of the resin (A), more preferably 5 to 150 parts by mass from the viewpoint of compatibility. When the content of a photopolymerizable compound is not less than 5 parts by mass, elution of exposed portion during development can be prevented to obtain a resin composition with a high residual film rate after development. When the content of a photopolymerizable compound is not more than 200 parts by mass, film whitening during film-forming can be suppressed.

The viscosity of the positive-working photosensitive resin composition according to the present invention is preferably 2 to 5,000 mPa·s. The viscosity can be measured using a cone-plate type (E type) rotational viscometer. By adjusting the solid content to give a viscosity of not less than 2 mPa·s, a desired film thickness is easily obtained. On the other hand, the viscosity of 5,000 mPa·s or less facilitates obtaining a highly uniform coating film. A positive photosensitive resin composition having such a viscosity can be easily obtained by adjusting the solid content, for example, to 5% to 60% by mass.

The following describes a method of forming a pattern of a heat-resistant resin as a cured film from the photosensitive resin composition according to the present invention.

First, the photosensitive resin composition according to the present invention is coated onto a substrate. Examples of the substrates include, but not limited to, silicon wafers, ceramics, gallium arsenic, organic circuit boards, inorganic circuit boards, composite substrates of sealing resins, such as a silicon wafer and an epoxy resin, and these substrates with components of a circuit disposed thereon. Examples of organic circuit boards include: glass-substrate copper-clad laminate sheets such as glass fabric/epoxy copper-clad laminate sheets; composite copper-clad laminate sheets such as glass nonwoven fabric/epoxy copper-clad laminate sheets; temporary adhesive carrier substrate; heat-resistant/thermoplastic substrates such as polyether imide resin substrates, polyether ketone resin substrates, and polysulfone resin substrates; flexible substrates such as polyester copper-clad film substrates, and polyimide copper-clad film substrates; and the like. In addition, examples of inorganic circuit boards include: ceramic substrates such as glass substrate; alumina substrates, aluminum nitride substrates, and silicon carbide substrates; and metallic substrates such as aluminum-based substrates and iron-based substrates. Examples of components of a circuit include: conductors including metals such as silver, gold, and copper; resistance elements including inorganic oxides and the like; low dielectric materials including glass-based materials and/or resins and the like; high dielectric materials including resins, highly dielectric inorganic particles, and the like; and insulating materials including glass-based materials and the like. Examples of the method of coating include methods such as spin-coating using a spinner, spray coating, roll coating, screen printing, blade coater, die coater, calender coater, meniscus coater, bat coater, roll coater, comma roll coater, gravure coater, screen coater, slit die coater. Moreover, the thickness of a coating film varies depending on the coating technique, the solid content of the composition, the viscosity, and the like, and the composition is typically applied such that the film thickness after drying is 0.1 to 150 μm. When it is a photosensitive uncured sheet it is then peeled after drying.

In order to enhance the adhesion between a substrate, such as silicon wafer, and the photosensitive resin composition, the substrate can also be subjected to a pre-treatment with the above-described silane coupling agent. For example, a surface treatment is carried out by spin-coating, dipping, spray coating, vaper treatment, or the like with a solution of 0.5% to 20% by mass of silane coupling agent dissolved in a solvent, such as isopropanol, ethanol, methanol, water, tetrahydrofuran, propylene glycol monomethyl ether acetate, propylene glycol monomethyl ether, ethyl lactate, or diethyl adipate. In some cases, a heat treatment up to 50° C. to 300° C. is subsequently carried out to promote the reaction between the substrate and the silane coupling agent. Subsequently, the substrate on which the photosensitive resin composition is coated or on which the photosensitive uncured sheet is laminated is dried to obtain a photosensitive resin composition coating film. For drying, an oven, hot plate, infrared light, or the like is preferably used at a temperature in the range of 50° C. to 150° C. for one minute to several hours.

Subsequently, this photosensitive resin composition-coated film is exposed by irradiating actinic rays through a mask having a desired pattern disposed on the composition. Examples of the actinic rays used for the exposure include ultraviolet rays, visible rays, electron beams, X-rays, and the like. For the present invention, i-line (365 nm), h-line (405 nm), or g-line (436 nm) radiation from a mercury lamp is preferably used.

For forming a pattern, after the exposure, by using a developer, the exposed portion is removed in case of positive-working and the unexposed portion is removed in case of negative-working. Examples of preferable developers include solutions of alkaline compounds such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, hexamethylenediamine, and the like. In some cases, ketones, such as N-methyl-2-pyrrolidone, N,N-dimethylformamide, N,N-dimethylacetamide, dimethylsulfoxide, γ-butyrolactone, and dimethylacrylamide; alcohols such as methanol, ethanol, and isopropanol; esters such as ethyl lactate and propylene glycol monomethyl ether acetate; ketones such as cyclopentanone, cyclohexanone, isobutylketones, and methyl isobutyl ketone, and the like solely or in combination of some kinds thereof may be added into these alkaline solution. Development can be carried out by a method in which a coating surface is sprayed with the aforementioned developer, immersed in the developer, ultrasonicated while being immersed, or sprayed with the developer with the substrate being rotated. After development, a rinse treatment is preferably carried out with water. Alcohols such as ethanol and isopropyl alcohol; esters such as ethyl lactate and propylene glycol monomethyl ether acetate; and the like may also be added to water for use in the rinse treatment.

After development, a thermal crosslinking reaction is promoted by applying a temperature of 150° C. to 500° C. Heat resistance and chemical resistance can be enhanced by crosslinking. This heat treatment is carried out for 5 minutes to 5 hours by first choosing temperatures and then increasing temperature in a stepwise manner, or by first choosing a certain temperature range and then continuously raising temperature. As one example of the former, the examples include a method in which a heat treatment is carried out at 130° C. and at 200° C., each for 30 minutes. As one example of the latter, the examples include a method in which a heat treatment is carried out by raising a temperature from room temperature to 400° C. in a linear manner over two hours. The curing conditions is preferably 150° C. to 350° C., and moreover, because the present invention provides a cured film excellent in curability especially at a low temperature, more preferably 160° C. to 250° C.

A heat-resistant resin-coated film formed from the photosensitive resin composition according to the present invention can be used for electronic components such as semiconductor devices and multilayer wiring boards. Specifically, the heat-resistant resin-coated film is suitably used for applications including, but not limited to, passivation films for semiconductors, surface protection films for semiconductor devices, interlayer dielectric films for semiconductor devices, interlayer insulating films for multilayer wiring for high density mounting, insulating layers for organic electroluminescent devices, and the like, and can be used in various structures.

Next, examples of application of the photosensitive resin composition according to the present invention to semiconductor devices having a bump will be described with reference to the drawings (Application Example 1). FIG. 1 is an enlarged cross-sectional view of a pad portion of a semiconductor device of the present invention having a bump. As illustrated in FIG. 1, a passivation film 3 is formed on an aluminum (hereinafter referred to as Al) pad 2 for input/output on a silicon wafer 1, and a via-hole is formed on the passivation film 3. Further on this film, an insulating film 4 is formed into a pattern that is made of the photosensitive resin composition according to the present invention, and further on this film, a metal film (Cr, Ti, or the like) 5 is formed so as to be connected with the Al pad 2, and a metal wiring (Al, Cu, or the like) 6 is formed by electroplating or the like. By etching the metal film 5 around a solder bump 10, insulation is established between each of pads. On the insulated pad, a barrier metal 8 and the solder bump 10 are formed. The thick-film processing with the photosensitive resin composition of the insulating film 7 can be carried out in a scribe line 9. When a softening component is introduced into the photosensitive resin composition, wafer warpage is so small that light exposure and wafer transport can be carried out with high precision. Moreover, because the resin according to the present invention is also excellent in high extensibility, the stress from the sealing resin can also be relieved in mounting by deformation of the resin itself, and any damage to the bump, wiring and the low-k layer can be therefore prevented to provide a semiconductor device with high reliability.

Figure 2:
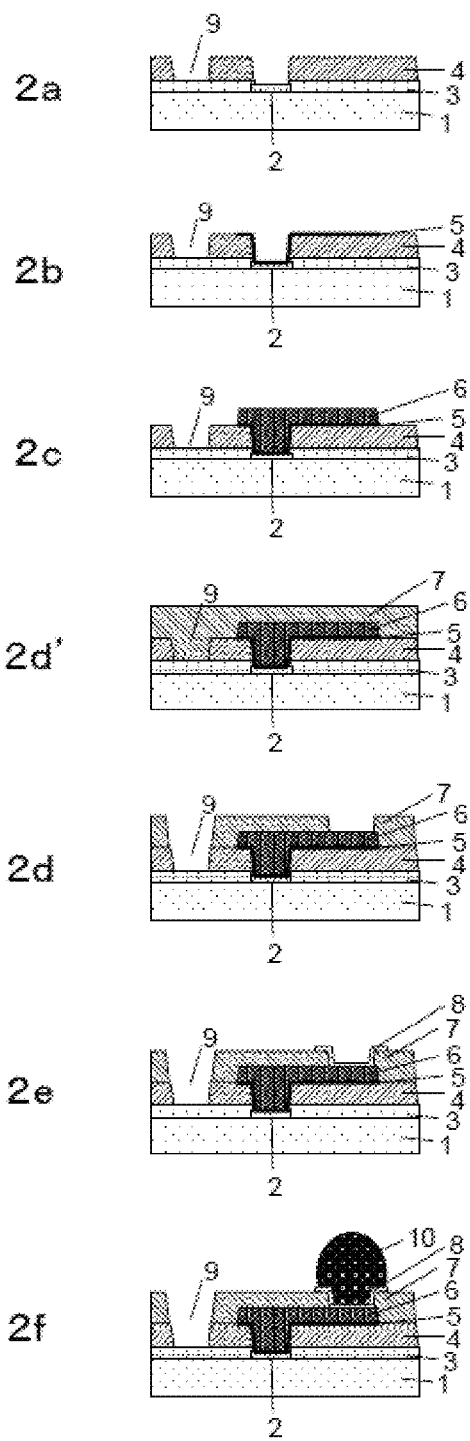
FIG. 2 depicts a detailed method of producing a semiconductor device having a bump.

Next, a method of manufacturing a semiconductor device will be described in detail in FIG. 2. As illustrated in 2a in FIG. 2, an Al pad 2 for input/output and also a passivation film 3 are formed on a silicon wafer 1, and an insulating film 4 is then formed as a pattern that is made of the photosensitive resin composition according to the present invention. Subsequently, as illustrated in 2b in FIG. 2, a metal film (Cr, Ti, or the like) 5 is formed so as to be connected with the Al pad 2, and a metal wiring 6 is formed as illustrated in 2c in FIG. 2 by film deposition based on a plating method. Next, as illustrated in 2d in FIG. 2, the photosensitive resin composition according to the present invention is coated, and an insulating film 7 is formed as a pattern as illustrated in 2d in FIG. 2 through a photolithographic process. Further wiring (so-called re-wiring) can be formed on the insulating film 7. For forming a multilayer wiring structure including at least two layers, the multilayer wiring structure in which the re-wirings of at least two layers are separated by an interlayer dielectric film obtained from the resin composition according to the present invention can be formed by repeating the aforementioned processes. In this case, the insulating film formed will come into contact with various liquid chemicals several times, but the insulating film obtained from the resin composition according to the present invention is so excellent in adhesion property that it can form a good multilayer wiring structure. The number of layers of the multilayer wiring structure has no upper limit, but those having 10 or less layers are often used.

Subsequently, as illustrated in 2e and 2f in FIG. 2, a barrier metal 8 and a solder bump 10 are formed. Then, the structure is diced along the last scribe line 9 to separate individual chips.

Figure 3:
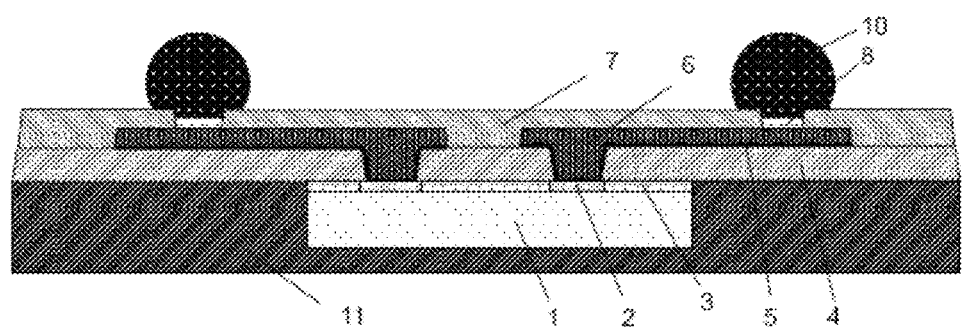
FIG. 3 depicts an enlarged cross-sectional view of a half pad portion showing an example of the present invention.

Next, application example 2 of the photosensitive resin composition according to the present invention to semiconductor devices having a bump will be described with reference to the drawings. FIG. 3 is an enlarged cross-sectional view of a pad portion of a semiconductor device having the insulating film according to the present invention, and is a structure which is referred to as fan-out wafer level package (fan-out WLP). In the same manner as the above-mentioned application example 1, a silicon wafer on which Al pad 2 and a passivation film 3 has been formed is diced into chips and then sealed with a resin 11. Throughout over this sealing resin 11 and the chips, an insulating film 4 is formed as a pattern that is made of the photosensitive resin composition according to the present invention and a metal (Cr, Ti, or the like) film 5 and metal wiring 6 are further formed. Subsequently, a barrier metal 8 and a solder bump 10 are formed in an opening part of an insulating film 7 formed on an off-chip sealing resin. A fan-out WLP is a semiconductor package in which a necessary number of terminals are ensured by providing a part extended using a sealing resin such as an epoxy resin in the periphery of the semiconductor chip, re-wiring from the electrode on the semiconductor chip to the extended parts and also mounting a solder ball on the extended part. In a fan-out WLP, wiring is installed so as to be across the borderline formed by the principal surface of the semiconductor chip and the principal surface of the sealing resin. In other words, an interlayer dielectric film is formed on a substrate made of two or more kinds of materials, which are a semiconductor chip and a sealing resin with metal wiring disposed on both of them, and wiring is formed on the interlayer dielectric film.

There is such a type of package that a fan-out WLP is made by a process in which an insulating film is disposed as an interlayer dielectric film between re-wirings on a support substrate on which a temporary adhesive material is disposed, and a silicon chip and a sealing resin are disposed thereon, followed by a step of separating between the support substrate on which a temporary adhesive material is disposed and the re-wirings. For this type of a package, it is preferable that an insulating film have low stress because a glass substrate, which is easier to be warped than a silicon wafer, or the like is often used.

Other than this, in a semiconductor package of a type that has a semiconductor chip embedded in a concave part which is formed in a glass epoxy resin substrate, wiring is disposed so as to be across the borderline between the principal surface of the semiconductor chip and the principal surface of the printed board. Also in this aspect, an interlayer dielectric film is formed on a substrate made of two or more kinds of materials, and wiring is then formed on the interlayer dielectric film. A cured film formed by curing the resin composition according to the present invention exhibits high extensibility and high adhesion to a semiconductor chip with metal wiring, and also exhibits high adhesion to a sealing resin such as an epoxy resin, and is therefore preferably used as an interlayer dielectric film installed on a substrate made of two or more kinds of materials.

Figure 4:
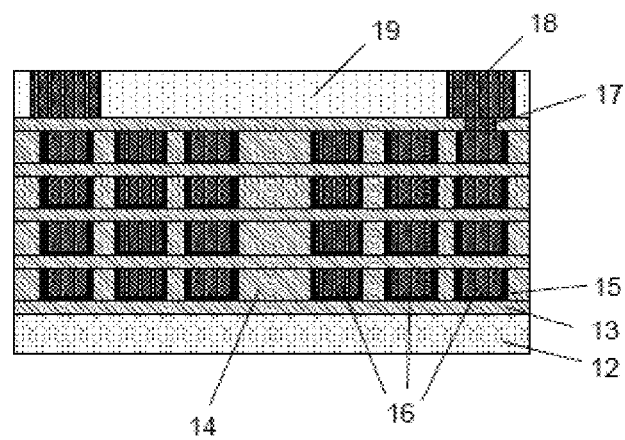
FIG. 4 depicts a cross-sectional view of a coil part of an inductor device showing an example of the present invention.

In a fan-out WLP, the miniaturization of re-wiring is proceeding. A cured film from the photosensitive resin composition according to the present invention is preferably used for a fine re-wiring because of high adhesion to metals even for wirings in which the width of the copper metal wiring and the spacing between wirings adjacent to each other are 5 µm or less. Next, application example 3 of the photosensitive resin composition according to the present invention to a coil part of an inductor device will be described with reference to the drawings. FIG. 4 is a cross-sectional view of a coil part having the insulating film according to the present invention. As illustrated in FIG. 3, the insulating film 13 is formed on the substrate 12, and the insulating film 14 is then formed as a pattern thereon. Ferrite or the like is used as the substrate 12. The photosensitive resin composition according to the present invention may be used for the insulating film 13 and/or the insulating film 14. The metal (Cr, Ti or the like) film 15 is formed in an opening of this pattern, and the metal wiring (Ag, Cu or the like) 16 is then formed by plating thereon. The metal wiring (Ag, Cu or the like) 16 is formed in a spiral form. By repeating the processes of 13 to 16 multiple times to be superimposed, a function as a coil can be given. Finally, the metal wiring 16 (Ag, Cu or the like) is connected to the electrode 0.18 with the metal wiring 17 (Ag, Cu or the like) and sealed by the sealing resin 19.

EXAMPLES

The present invention will be described below by way of Examples, but the present invention is not limited thereto. First, evaluation procedures in the respective Examples and Comparative Examples will be described. A photosensitive resin composition (hereinafter referred to as a varnish) filtered through a 1 µm filter made of polytetrafluoroethylene (manufactured by Sumitomo Electric Industries, Ltd.) in advance was used for the evaluation.

(1) Measurement of Molecular Weights and Imidation Rates

The weight average molecular weight (Mw) of a resin was confirmed using the GPC (gel permeation chromatography) instrument Waters 2690-996 (manufactured by Nihon-Waters K.K.). Measurement was carried out using N-methyl-2-pyrrolidone (hereinafter referred to as NMP) as a developing solvent to calculate the weight average molecular weight (Mw) and the dispersity (PDI=Mw/Mn) in terms of polystyrene.

For the imidation rate of a resin, the solution of the resin in γ-butyrolactone was spin-coated on a silicon wafer, dried at 120° C. for 3 minutes to obtain a coating film with a thickness of 5 µm, and the coating film was measured by infrared absorption spectroscopy to confirm the presence of absorption peaks of an imide structure (around 1780 $cm^{-1}$ and around 1377 $cm^{-1}$). Next, an imidation rate of a sample wherein the coating film has been heat-treated at 350° C. for an hour is measured as a 100% sample by infrared absorption spectroscopy, the content of an imide group before heat-treatment was calculated by comparison of around 1377 $cm^{-1}$ peak strengths of the resin between before and after heat-treatment to determine the imidation rate. In the measurement of the infrared absorption spectra, "FT-720" (trade name, manufactured by Horiba, Ltd.) was used as a measuring device.

(2) Ring Closure Rate of Polyhydroxyamide

For the calculation of a ring closure rate in the present examples, the varnish was applied onto a silicon wafer by spin-coating and then dried at 120° C. for 3 minutes to obtain a coating film having a film thickness of 5 µm. This coating film was further heated either at 220° C. for 10 minutes or at 300° C. to 350° C. for 10 minutes to obtain cured films (a cured film (A) heated at 220° C. and a cured film (B) heated at 300 to 350° C.). The infrared absorption spectra of the cured film (A) and cured film (B) were measured to determine the absorbance at a peak at about 1050 $cm^{-1}$ due to C—O stretching vibration. The ring closure rate of the cured film (A) was calculated using the ring closure rate of polyhydroxyamide of the cured film (B) as 100%. The ring closure rate as used herein refers to the ring closure rate of a poly(o-hydroxyamide) structural unit.

(3) Low Stress Evaluation

The varnish is coated by a spin coating method (Coater/Developer ACT-8 was used) on a silicon wafer using Coater/Developer ACT-8 (manufactured by Tokyo Electron Limited) in such a manner that the film thickness was 10 µm after prebaking at 120° C. for 3 minutes. After prebaking, heat treatment was carried out using the Inert Gas Oven CLH-21CD-S (manufactured by Koyo Thermo Systems Co., Ltd.) in such a manner that the temperature was increased to 220° C. at a temperature rising rate of 3.5° C./min and then held constant at 220° C. for an hour at an oxygen concentration of not higher than 20 ppm under nitrogen gas flow. Upon reaching a temperature of not higher than 50° C., the silicon wafer was taken out and the cured film was measured by a Stress Measurement System FLX2908 (manufactured by KLA-Tencor Corporation). Based on the results, it was evaluated as Poor (D) when the result was 30 MPa or more, Fair (C) when the result was 20 MPa or more and less than 30 MPa, Good (B) when the result was 16 MPa or more and less than 20 MPa, and Excellent (A) when the result was less than 16 MPa.

(4)-1. Extensibility Evaluation

The varnish was coated onto an eight-inch silicon wafer by a spin-coating method using the Coater/Developer ACT-8 and prebaked in such a manner that the film thickness was 11 µm after prebaking at 120° C. for 3 minutes, followed by a heat-treatment using the Inert Gas Oven CLH-21CD-S (manufactured by Koyo Thermo Systems Co., Ltd.), in such a manner that the temperature was increased to 220° C. at a rate of 3.5° C./min and then held constant at 220° C. for an hour at an oxygen concentration of not higher than 20 ppm. When the temperature was 50° C. or less, the wafer was taken out and immersed in a 45 mass % hydrofluoric acid for 5 minutes to thereby separate the resin composition film from the wafer. This film was cut into 1 cm wide×9 cm long strips, which were pulled using the TENSILON RTM-100 (manufactured by Orientec Corporation) at a tension rate of 50 mm/minute at a room temperature of 23.0° C. and a humidity of 45.0% RH, and measured for an elongation at break. Ten strips per specimen were measured to determine the average value of the top five results. The film was evaluated as Excellent (A) when the elongation at break was 90% or more; Good (B) when it was 70% or more and less than 90; Fair (C) when it was 40% or more and less than 70%; and Poor (D) when it was less than 40%.

(4)-2. Extensibility Evaluation after High-Temperature Storage (HTS)

The varnish was coated onto an eight-inch silicon wafer by a spin-coating method using the Coater/Developer ACT-8 and prebaked in such a manner that the film thickness was 11 μm after prebaking at 120° C. for 3 minutes, followed by a heat-treatment using the Inert Gas Oven CLH-21CD-S (manufactured by Koyo Thermo Systems Co., Ltd.), in such a manner that the temperature was increased to 220° C. at a rate of 3.5° C./min and then held constant at 220° C. for an hour at an oxygen concentration of not higher than 20 ppm. Upon reaching a temperature of not higher than 50° C., the wafer was taken out and then treated at 150° C. for 500 hours using a high-temperature storage testing chamber. The wafer was taken out and immersed in 45 mass % hydrofluoric acid for 5 minutes to separate the resin composition film from the wafer. This film was cut into 1 cm wide×9 cm long strips, which were pulled using the TENSILON RTM-100 (manufactured by Orientec Corporation) at a tension rate of 50 mm/minute at a room temperature of 23.0° C. and a humidity of 45.0% RH, and measured for an elongation at break. Ten strips per specimen were measured to determine the average value of the top five results. The film was evaluated as Excellent (A) when the elongation at break was 60% or more; Good (B) when it was 20% or more and less than 60%; Fair (C) when it was 5% or more and less than 20%; and Poor (D) when it was less than 5%.

(5)-1. Evaluation of Adhesion to Metals

Titanium and copper were sputtered to a thickness of 100 nm onto a silicon wafer and then plated electrolytically to provide a substrate having a metallic material layer in which a copper-plated film with a thickness of 2 μm is formed on its surface. The varnish was coated onto this substrate by a spin-coating method using a spinner (manufactured by Mikasa Co., Ltd.) and then baked on a hot plate (D-SPIN, manufactured by Dai Nippon Screen Manufacturing Co., Ltd) at 120° C. for 3 minutes to make a prebaked film of which the thickness was finally 8 μm. These films were cured under a nitrogen gas stream (the oxygen concentration: 20 ppm or less) using the clean oven (CLH-21CD-S, manufactured by Koyo Thermo Systems Co., Ltd.) at 140° C. for 30 minutes and then at a raised temperature of 220° C. for further 1 hour to afford a photosensitive cured resin film. The cured film was notched using a single edged knife in a grid shape of 10 rows and 10 lines spaced 2 mm apart. The adhesion property between the metal material and the cured resin film was evaluated by counting the number of peeled squares out of 100 squares which, were tested to be peeled off by "CELLOTAPE (registered trademark)". Moreover, a pressure cooker test (PCT) chamber (HAST CHAMBER EHS-211MD, manufactured by Tabai Espec Corporation) was used to PCT-treat the test samples under the saturation conditions at 121° C. at 2 atmospheres for 100 hours and 400 hours, and the peeling-off test as described above was then carried out.

(5)-2. Evaluation of Adhesion to Metals after High-Temperature Storage

Similarly as (5)-1, a cured film notched in a grid shape was heat-treated at 150° C. for 500 hours using a high-temperature storage testing chamber, and then tested for the above-mentioned peeling-off test. For any substrate, in the peeling-off test, based on the number of peeled squares, the film was was evaluated as the following: Excellent (A) when the number was 0; Good (B) when the number was more than 0 and less than 20; Fair (C) when the number was 20 or more and less than 50; and Poor (D) when the number was 50 or more.

Synthesis Example A: Synthesis of Acid A

In a 250-ml three-necked flask, 27.2 g (0.4 mol) of imidazole and then 100 g of methylene chloride were placed under nitrogen flow, and then stirred at room temperature. The mixture was cooled to −5° C. or lower, and the suspension of 29.5 g (0:1 mol) of 4,4'-diphenyl ether dicarboxylic acid dichloride in 100 g of methylene chloride, is added dropwise over one hour being careful not to allow the temperature of the reaction solution to exceed 0° C. After adding dropwise, the reaction mixture was stirred at room temperature for another 3 hours, and a precipitate generated during the reaction was filtered. The filtered precipitate was washed with pure water several times, dried at 50° C. in a vacuum oven for 100 hours to obtain an acid A of the following formula.

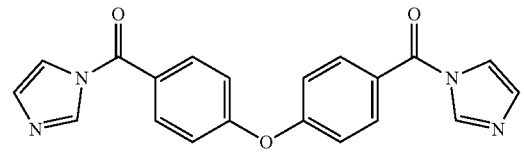 [SMILES: O=C(c1ccc(Oc2ccc(C(=O)n3ccnc3)cc2)cc1)n1ccnc1]

Synthesis Example B: Synthesis of Acid B

In a 250-ml three-necked flask, under nitrogen flow, 27.2 g (0.4 mol) of imidazole and then 100 g of NMP were stirred at room temperature to be dissolved. The mixture was cooled to −5° C. or lower, and the solution of dodecanedioic acid dichloride (26.72 g, 0.1 mol) in 100 g of NMP is added dropwise over one hour being careful not to allow the temperature of the reaction solution to exceed 0° C. After adding dropwise, the reaction mixture was stirred at room temperature for another 3 hours, followed by pouring the reaction mixture into 1 L of pure water, and a precipitate was filtered. The filtered precipitate was washed with pure water several times, dried at 50° C. in a vacuum oven for 100 hours to obtain an acid B of the following formula.

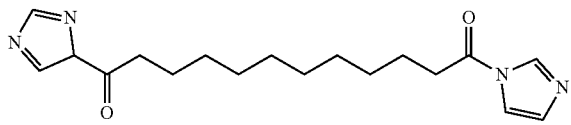 [SMILES: O=C(CCCCCCCCCCC(=O)n1ccnc1)C1C=NC=N1]

Synthesis Example 1: Synthesis of Resin (I)

Under dry nitrogen flow, 2,2-bis(3-amino-4-hydroxyphenyl)hexafluoropropane (hereinafter referred to as BAHF) (11.9 g, 0.033 mol), HM (3:16 g, 0.015 mol), and 1,3-bis(3-aminopropyl)tetramethyldisiloxane (0.62 g, 0.0025 mol) were dissolved in 100 g of NMP. Furthermore, acid A (11.26 g, 0.038 mol), 4,4'-oxydiphthalic anhydride (2.33 g, 0.0075 mol), 5-norbornene-2,3-dicarboxylic acid (0.82 g, 0.005 mol) and also 25 g of NMP were added and allowed to react at 85° C. for 3 hours. After completion of the reaction, the reaction mixture was cooled to room temperature, and acetic acid (13.20 g, 0.25 mol) was added with 25 g of NMP, and the mixture was stirred at room temperature for an hour. After the stirring was finished, the solution was poured into 1.5 L of water to obtain a white precipitate. This precipitate was collected by filtration, washed with water three times, and then dried in a forced-air dryer at 50° C. for 3 days to obtain the resin (I) as powder. The imidation rate of the resin thus obtained was 75%. The weight average molecular weight was 32,600 and the PDI was 1.9.

Synthesis Example 2: Synthesis of Resin (II)

According to Synthesis example 1, the similar procedure was carried out using BAHF (11.9 g, 0.033 mol), 1,2-bis(2-aminoethoxy)ethane (2.22 g, 0.015 mol), 1,3-bis(3-aminopropyl)tetramethyldisiloxane (0.62 g, 0.0025 mol), acid A (11.26 g, 0.038 mol), 4,4'-oxydiphthalic anhydride (2.33 g, 0.0075 mol), 5-norbornene-2,3-dicarboxylic acid (0.82 g, 0.005 mol), acetic acid (13.20 g, 0.25 mol), and 150 g of NMP to obtain the resin (II) as powder. The imidation rate of the resin thus obtained was 82%. The weight average molecular weight was 31,500 and the PDI was 1.95.

Synthesis Example 3: Synthesis of Resin (III)

According to Synthesis example 1, the similar procedure was carried out using BAHF (11.9 g, 0.033 mol), RT-1000 (15.0 g, 0.015 mol), 1,3-bis(3-aminopropyl)tetramethyldisiloxane (0.62 g, 0.0025 mol), acid A (11.26 g, 0.038 mol), 4,4'-oxydiphthalic anhydride (2.33 g, 0.0075 mol), 5-norbornene-2,3-dicarboxylic acid (0.82 g, 0.005 mol), acetic acid (13.20 g, 0.25 mol), and 150 g of NMP to obtain the resin (III) as powder. The imidation rate of the resin thus obtained was 96%. The weight average molecular weight was 36,300 and the PDI was 1.9.

Synthesis Example 4: Synthesis of Resin (IV)

According to Synthesis example 1, the similar procedure was carried out using BAHF (11.9 g, 0.033 mol), HT-1000 (15.0 g, 0.015 mol), 1,3-bis(3-aminopropyl)tetramethyldisiloxane (0.62 g, 0.0025 mol), acid A (11.26 g, 0.038 mol), 4,4'-oxydiphthalic anhydride (2.33 g, 0.0075 mol), 5-norbornene-2,3-dicarboxylic acid (0.82 g, 0.005 mol), acetic acid (13.20 g, 0.25 mol), and 150 g of NMP to obtain the resin (IV) as powder. The imidation rate of the resin thus obtained was 97%. The weight average molecular weight was 36,100 and the PDI was 1.9.

Synthesis Example 5: Synthesis of Resin (V)

According to Synthesis example 1, the similar procedure was carried out using BAHF (11.9 g, 0.033 mol), RT-1000 (15.0 g, 0.015 mol), 1,3-bis(3-aminopropyl)tetramethyldisiloxane (0.62 g, 0.0025 mol), acid A (11.26 g, 0.038 mol), 1,2,3,4-cyclobutanetetracarboxylic acid dianhydride (hereinafter referred to as CBDA) (1.47 g, 0.0075 mol), 5-norbornene-2,3-dicarboxylic acid (0.82 g, 0.005 mol), acetic acid (13.20 g, 0.25 mol), and 150 g of NMP to obtain the resin (V) as powder. The imidation rate of the resin thus obtained was 97%. The weight average molecular weight was 36,800 and the PI was 1.9.

Synthesis Example 6: Synthesis of Resin (VI)

According to Synthesis example 1, the similar procedure was carried out using BAHF (11.9 g, 0.033 mol), HT-1000 (15.0 g, 0.015 mol), 1,3-bis(3-aminopropyl)tetramethyldisiloxane (0.62 g, 0.0025 mol), acid B (12.39 g, 0.038 mol), CBDA (1.47 g, 0.0075 mol), 5-norbornene-2,3-dicarboxylic acid (0.82 g, 0.005 mol), acetic acid (13.20 g, 0.25 mol), and 150 g of NMP to obtain the resin (VI) as powder. The imidation rate of the resin thus obtained was 97%. The weight average molecular weight was 32,300 and the PDI was 1.9.

Synthesis Example 7: Synthesis of Resin (VII)

According to Synthesis example 1, the similar procedure was carried out using BAHF (9.16 g, 0.025 mol), RT-1000 (22.5 g, 0.023 mol), 1,3-bis(3-aminopropyl)tetramethyldisiloxane (0.62 g, 0.0025 mol), acid B (12.39 g, 0.038 mol), CBDA (1.47 g, 0.0075 mol), 5-norbornene-2,3-dicarboxylic acid (0.82 g, 0.005 mol), acetic acid (13.20 g, 0.25 mol), and 150 g of NMP to obtain the resin (VII) as powder. The imidation rate of the resin thus obtained was 97%. The weight average molecular weight was 32,800 and the PDI was 1.9.

Synthesis Example 8: Synthesis of Resin (VIII)

According to Synthesis example 1, the similar procedure was carried out using BAHF (11.9 g, 0.033 mol), RT-1000 (15.0 g, 0.015 mol), 1,3-bis(3-aminopropyl)tetramethyldisiloxane (0.62 g, 0.0025 mol), acid A (6.01 g, 0.020 mol), 4,4'-oxydiphthalic anhydride (7.75 g, 0.0025 mol), 5-norbornene-2,3-dicarboxylic acid (0.82 g, 0.005 mol), acetic acid (13.20 g, 0.25 mol), and 150 g of NMP to obtain the resin (VIII) as powder. The imidation rate of the resin thus obtained was 97%. The weight average molecular weight was 31,800 and the PDI was 1.9.

Synthesis Example 9: Synthesis of Resin (IX)

According to Synthesis example 1, the similar procedure was carried out using BAHF (11.9 g, 0.033 mol), RT-1000 (15.0 g, 0.015 mol), 1,3-bis(3-aminopropyl)tetramethyldisiloxane (0.62 g, 0.0025 mol), acid B (12.39 g, 0.038 mol), 4,4'-oxydiphthalic anhydride (2.33 g, 0.0075 mol), 5-norbornene-2,3-dicarboxylic acid (0.82 g, 0.005 mol), acetic acid (13.20 g, 0.25 mol), and 150 g of NMP to obtain the resin (IX) as powder. The imidation rate of the resin thus obtained was 97%. The weight average molecular weight was 33,800 and the PDI was 1.9.

Synthesis Example 10: Synthesis of Resin (X)

According to Synthesis example 1, the similar procedure was carried out using BAHF (11.9 g, 0.033 mol), RT-1000 (15.0 g, 0.015 mol), 1,3-bis(3-aminopropyl)tetramethyldisiloxane (0.62 g, 0.0025 mol), acid A (14.26 g, 0.048 mol), 5-norbornene-2,3-dicarboxylic acid (0.41 g, 0.0025 mol), acetic acid (13.20 g, 0.25 mol), and 150 g of NMP to obtain the resin (X) as powder. The imidation rate of the resin thus obtained was 97%. The weight average molecular weight was 36,200 and the PDI was 1.9.

Synthesis Example 11: Synthesis of Resin (XI)

According to Synthesis example 1, the similar procedure was carried out using BAHF (18.31 g, 0.06 mol), dodecanedioic acid dichloride (hereinafter referred to as acid C, 12.02 g, 0.045 mol), and 150 g of NMP to obtain the resin (XI) as powder. The weight average molecular weight was 35,800 and the PDI was 2.0.

Synthesis Example 12: Synthesis of Resin (XII)

According to Synthesis example 1, the similar procedure was carried out using BAHF (18.31 g, 0.06 mol), acid C (5.34 g, 0.02 mol), 4,4'-oxydiphthalic anhydride (7.75 g, 0:025 mol) and 150 g of NMP to obtain the resin (XII) as powder. The imidation rate of the resin thus obtained was 43%. The weight average molecular weight was 33,400 and the PDI was 1.9.

Synthesis Example 13: Synthesis of Resin (XIII)

According to Synthesis example 1, the similar procedure was carried out using BAHF (18.31 g, 0.06 mol), acid A (7.51 g, 0.025 mol), 4,4'-oxydiphthalic anhydride (7.75 g, 0.025 mol) and 150 g of NMP to obtain the resin (XIII) as powder. The imidation rate of the resin thus obtained was 59%. The weight average molecular weight was 35,100 and the PDI was 1.9.

Synthesis Example 14: Synthesis of a Cyclized Polyimide Resin (XIV)

Under dry nitrogen gas flow, BAHF (11.9 g, 0.0325 mol), RT-1000 (15.0 g, 0.015 mol), 1,3-bis(3-aminopropyl)tetramethyldisiloxane (0.62 g, 0.0025 mol), and 5-norbornene-2,3-dicarboxylic acid (0.82 g, 0.005 mol) were dissolved in 125 g of NMP. To this, 4,4'-oxydiphthalic anhydride (13.95 g, 0.045 mol) was added along with 25 g of NMP, and the resulting mixture was stirred at 60° C. for one hour and then at 180° C. for 4 hours. After the stirring was finished, the solution was poured into 3 L of water to afford a white precipitate. This precipitate was collected by filtration, washed three times with water, and then dried in a forced-air drier at 50° C. for 3 days to obtain a cyclized polyimide resin (XIV) as powder. The imidation rate of the resin thus obtained was 97%. The weight average molecular weight was 38,800 and the PDI was 1.9.

Synthesis Example 15: Synthesis of Phenol Resin (XV)

Under dry nitrogen gas flow, 70.2 g of m-cresol (0.65 mol), 37.8 g of p-cresol (0.35 mol), 75.5 g of 37-wt % formaldehyde aqueous solution (formaldehyde: 0.93 mol), 0.63 g of oxalic acid dihydrate (0.005 mol), and 264 g of methyl isobutyl ketone were charged, the flask was immersed in an oil bath, and the mixture was then subjected to polycondensation under reflux for 4 hours. Subsequently, the temperature of the oil bath was raised over 3 hours, the pressure inside the flask was reduced to 40 to 67 hPa, volatiles were removed, and a dissolved resin was cooled to room temperature to obtain an alkaline-soluble novolac resin (XV) as polymeric solid. Mw was found to be 3,500 by GPC. γ-Butyrolactone (GBL) is added to resulting novolac resin (XV) to obtain a phenol resin (XV) solution of which the solid content is 43 wt % of novolac resin.

Synthesis Example 16: Synthesis of Phenol Resin (XVI)

Into the mixed solution of 500 ml of tetrahydrofuran and 0.01 mole of sec-butyllithium as an initiator, totally 20 g of p-t-butoxystyrene and styrene are added in a mole ratio of 3:1, and allowed to polymerize with stirring for 3 hours. Polymerization was terminated by adding 0.1 mole of methanol to the reaction solution. Next, in order to purify the polymer, the reaction mixture was poured into methanol, the precipitated polymer was then dried to obtain a white polymer. Furthermore, this was dissolved in 400 ml of acetone, a small amount of concentrated hydrochloric acid is added at 60° C. and stirred for 7 hours, followed by adding water to precipitate a polymer, and the polymer is converted to hydroxystyrene by deprotecting p-t-butoxystyrene, washed and dried to obtain purified phenol resin (XVI) as a polyhydroxystyrene resin which is a copolymer of p-hydroxystyrene and styrene.

Synthesis Example 17: Synthesis of Phenol Resin (XVII)

A phenol resin was dissolved in a solution of 80 g of sodium hydroxide (2.0 mol) in 800 g of pure water. After complete dissolution, 686 g of 36 to 38 wt % formalin aqueous solution was added dropwise at 20 to 25° C. over 2 hours. Subsequently, the mixture was stirred at 20 to 25° C. for 17 hours. To this mixture, 98 g of sulfuric acid and 552 g of water were added to be neutralized, and allowed to stand for 2 days. After allowing to stand, the generated white solid was washed with 100 mL of water. This white solid was dried in vacuum at 50° C. for 48 hours. Next, the compound thus obtained was dissolved in 300 mL of methanol, and stirred at room temperature for 24 hours after adding 2 g of sulfuric acid. To this solution, 15 g of an anionic ion exchange resin (Amberlyst IRA96SB, manufactured by Rohm & Haas Company) was added, stirred for an hour and removed the ion exchange resin by filtration. Subsequently, 500 mL of γ-butyrolactone was added, and methanol was removed by rotary evaporating to obtain 35% concentration of phenol resin (XVII) as a γ-butyrolactone solution.

Synthesis Example 18: Synthesis of Resin (III-2)

Under dry nitrogen gas flow, BAHF (11.0 g, 0.030 mol) and RT-1000 (15.0 g, 0.015 mol) were dissolved in 100 g of NMP. Acid A (11.26 g, 0.038 mol) was added with 10 g of NMP, and the mixture was allowed to react at 85° C. for 3 hours. Subsequently, BAHF (1.0 g, 0.0025 mol), 1,3-bis(3-aminopropyl)tetramethyldisiloxane (0.62 g, 0.0025 mol), and 5-norbornene-2,3-dicarboxylic acid (0.82 g, 0.005 mol) were added with 5 g of NMP, and the mixture was allowed to react at 85° C. for an hour, and 4,4'-oxydiphthalic anhydride (2.33 g, 0.0075 mol) was added with 5 g of NMP, and the mixture was allowed to react at 85° C. for an hour. After completion of the reaction, the reaction mixture was cooled to room temperature, and acetic acid (13.20 g, 0.25 mol) was added with 25 g of NMP, and the mixture was stirred at room temperature for an hour. After the stirring was finished, the solution was poured into 1.5 L of water to obtain a white precipitate. This precipitate was collected by filtration, washed with water three times, and then dried in a forced-air dryer at 50° C. for 3 days to obtain the resin (III-2) as powder. The imidation rate of the resin thus obtained was 70%. The weight average molecular weight was 32,600 and the PDI was 1.9.

Synthesis Example 19: Synthesis of Resin (VI-2)

According to Synthesis example 18, BAHF (11.0 g, 0.030 mol), HT-1000 (15.0 g, 0.015 mol), acid B (12.39 g, 0.038 mol) were allowed to react at 85° C. for 3 hours, and BAHF (1.0 g, 0.0025 mol), 1,3-bis(3-aminopropyl)tetramethyldisiloxane (0.62 g, 0.0025 mol), and 5-norbornene-2,3-dicarboxylic acid (0.82 g, 0.005 mol) were then allowed to react at 85° C. for an hour, and CBDA (1.47 g, 0.0075 mol) was then allowed to at 85° C. for an hour. The similar procedure was carried out using acetic acid (13.20 g, 0.25 mol) and 150 g of NMP to obtain the resin (VI) as powder. The imidation rate of the resin thus obtained was 75%. The weight average molecular weight was 34,200 and the PDI was 1.9.

The molar ratios of resin components of the resin I to XIV and phenol resins are shown in Table 1.

TABLE 1

| | | Diamine component (molar ratio) | | | | | | Acid component (molar ratio) | | | Acid dianhydride (molar ratio) | | Acid anhydride (molar ratio) | Phenol resin |
|---|---|---|---|---|---|---|---|---|---|---|---|---|---|---|
| | Resin | BAHF | HM | 1,2-Bis(2-aminoethoxy)ethane | RT-1000 | HT-1000 | SiDA | Acid A | Acid B | Acid C | ODPA | CBDA | NA | |
| Example 1 | I | 65 | 30 | — | — | — | 5 | 75 | — | — | 15 | — | 10 | — |
| Example 2 | II | 65 | — | 30 | — | — | 5 | 75 | — | — | 15 | — | 10 | — |
| Example 3 | III | 65 | — | — | 30 | — | 5 | 75 | — | — | 15 | — | 10 | — |
| Example 4 | IV | 65 | — | — | — | 30 | 5 | 75 | — | — | 15 | — | 10 | — |
| Example 5 | V | 65 | — | — | 30 | — | 5 | 75 | — | — | — | 15 | 10 | — |
| Example 6 | VI | 65 | — | — | — | 30 | 5 | — | 75 | — | — | 15 | 10 | — |
| Example 7 | VII | 50 | — | — | 45 | — | 5 | 75 | — | — | — | 15 | 10 | — |
| Example 8 | VIII | 65 | — | — | 30 | — | 5 | 40 | — | — | 50 | — | 10 | — |
| Example 9 | IX | 65 | — | — | 30 | — | 5 | — | 75 | — | 15 | — | 10 | — |
| Example 10 | X | 65 | — | — | 30 | — | 5 | 95 | — | — | — | — | 5 | — |
| Example 11 | III | 65 | — | — | 30 | — | 5 | 75 | — | — | 15 | — | 10 | XV |
| Example 12 | III | 65 | — | — | 30 | — | 5 | 75 | — | — | 15 | — | 10 | XVI |
| Example 13 | III | 65 | — | — | 30 | — | 5 | 75 | — | — | 15 | — | 10 | XVII |
| Comparative example 1 | XI | 100 | — | — | — | — | — | — | — | 90 | — | — | — | — |
| Comparative example 2 | XII | 100 | — | — | — | — | — | — | — | 40 | 50 | — | — | — |
| Comparative example 3 | XIII | 100 | — | — | — | — | — | 50 | — | — | 50 | — | — | — |
| Comparative example 4 | XIV | 65 | — | — | 30 | — | 5 | — | — | — | 90 | — | 10 | — |

Examples 1 to 13 and Comparative Examples 1 to 3

To 10 g of each of resin obtained (I) to (XIV), 2.0 g of a photo acid generator of the following formula, 0.5 g of HMOM-TPHAP, 0.5 g of MW-100LM, and 20 g of γ-butyrolactone as a solvent were added to produce a varnish.

For Examples 11 to 13, a photo acid generator, HMOM-TPHAP, MW-100LM were added and 2 g of each of phenol resin (XV) to (XVII) were further added to produce a varnish. These properties were measured by the above-mentioned evaluation methods. The measurement results are shown in Table 2.

TABLE 2

| | Ring closure rate of polyhydroxyamide | Evaluation of low stress | | Evaluation of extensibility | | Evaluation of adhesion to metals | | | |
|---|---|---|---|---|---|---|---|---|---|
| | | | | | | Number of separation | | Number of separation after PCT | Judgement after PCT |
| | % | Stress/MPa | Judgement | Elongation/% | Judgement | separation | Judgement | | |
| Example 1 | 3 | 27 | C | 35 | C | 5 | B | 5 | B |
| Example 2 | 5 | 20 | B | 55 | C | 0 | A | 0 | A |
| Example 3 | 2 | 15 | A | 98 | A | 0 | A | 0 | A |
| Example 4 | 4 | 14 | A | 94 | A | 0 | A | 0 | A |
| Example 5 | 1 | 12 | A | 101 | A | 0 | A | 0 | A |
| Example 6 | 73 | 14 | A | 110 | A | 4 | B | 4 | B |
| Example 7 | 5 | 7 | A | 103 | A | 0 | A | 10 | B |
| Example 8 | 7 | 11 | A | 62 | C | 0 | A | 0 | A |
| Example 9 | 72 | 15 | A | 113 | A | 6 | B | 7 | B |
| Example 10 | 3 | 17 | B | 101 | A | 2 | B | 2 | B |
| Example 11 | 4 | 10 | A | 92 | A | 0 | A | 0 | A |
| Example 12 | 8 | 11 | A | 90 | A | 0 | A | 0 | A |
| Example 13 | 7 | 15 | A | 95 | A | 0 | A | 0 | A |
| Comparative example 1 | 73 | 30 | D | 73 | B | 100 | D | — | — |
| Comparative example 2 | 72 | 27 | C | 55 | C | 100 | D | — | — |
| Comparative example 3 | 6 | 27 | C | 23 | D | 10 | B | 10 | B |
| Comparative example 4 | — | 13 | A | 20 | D | 0 | A | 10 | B |

Examples 14 to 25, Comparative Examples 5 to 7

To 10 g of each of resin obtained (III), (III-2), (VI) and (VI-2), 2.0 g of a photo acid generator of the following formula, 0.5 g of HMOM-TPHAP, 0.5 g of MW-100LM, and 20 g of γ-butyrolactone as a solvent were added. (D-1), (D-2), (E-1), (E-2) and (F) were further added in amounts shown in Table 3 to produce a varnish.

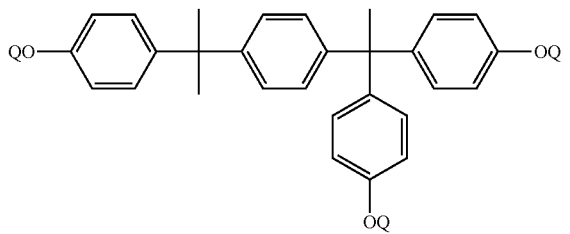
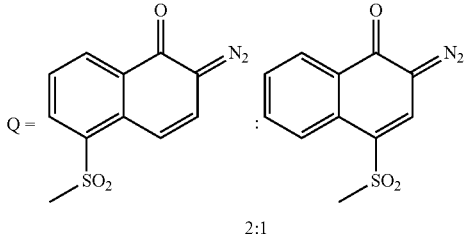

photo acid generator

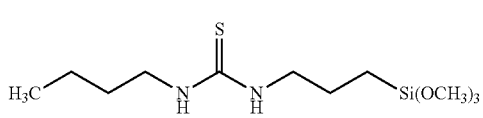
D1

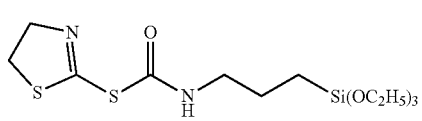
D2

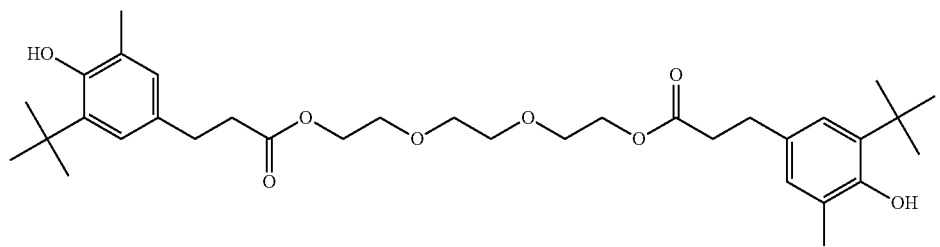
E1
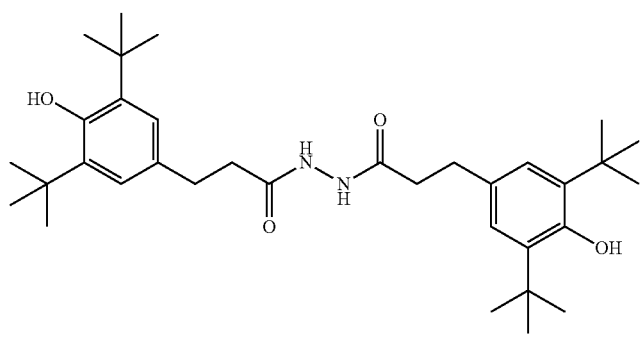
E2
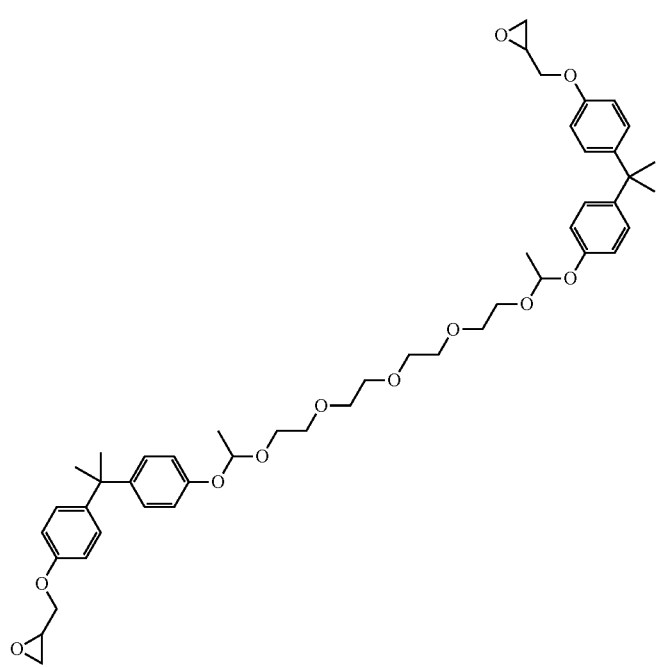
F

The molar ratio of resin components of the resin (III-2) is the same as the resin III, and the molar ratio of resin components of the resin (VI-2) is the same as the resin VI.

The obtained results are shown in Table 3.

13: insulating film
14: insulating film
15: metal (Cr, Ti, or the like) film
16: metal wiring (Ag, Cu, or the like)

TABLE 3

| | Resin | Ring closure rate of polyhydroxyamide % | Loadings of components (D), (E) and (F) | | | Evaluation of low stress | | Evaluation of extensibility | |
|---|---|---|---|---|---|---|---|---|---|
| | | | component (D)/parts by weight | component (E)/parts by weight | component (F)/parts by weight | Stress/MPa | Judgement | Elongation/% | Judgement |
| Example 14 | III | 2 | — | — | — | 15 | A | 98 | A |
| Example 15 | III-2 | 5 | — | — | — | 15 | A | 105 | A |
| Example 16 | VI | 73 | — | — | — | 14 | A | 110 | A |
| Example 17 | VI-2 | 75 | — | — | — | 14 | A | 110 | A |
| Example 18 | III | 2 | (D-1) 0.15 g | — | — | 15 | A | 97 | A |
| Example 19 | III | 2 | (D-2) 0.15 g | — | — | 15 | A | 98 | A |
| Example 20 | III | 2 | — | (E-1) 0.15 g | — | 15 | A | 99 | A |
| Example 21 | III | 2 | — | (E-2) 0.15 g | — | 15 | A | 100 | A |
| Example 22 | III | 2 | (D-2) 0.15 g | (E-2) 0.15 g | — | 15 | A | 98 | A |
| Example 23 | III | 2 | (D-2) 0.15 g | (E-1) 0.15 g | (F) 1.5 g | 12 | A | 110 | A |
| Example 24 | III | 2 | (D-2) 0.15 g | (E-1) 0.15 g | (F) 0.18 g | 15 | A | 99 | A |
| Example 25 | III | 2 | (D-2) 0.15 g | (E-1) 0.15 g | (F) 2.0 g | 12 | A | 111 | A |
| Comparative example 5 | XI | 73 | — | — | — | 30 | D | 73 | B |
| Comparative example 6 | XIV | — | — | — | — | 13 | A | 20 | D |
| Comparative example 7 | XI | 73 | (D-1) 0.15 g | (E-1) 0.15 g | (F) 1.5 g | 30 | D | 73 | B |

| | Evaluation of extensibility after HTS | | Evaluation of adhesion to metals | | | | | |
|---|---|---|---|---|---|---|---|---|
| | Elongation/% | Judgement | Number of separation | Judgement | Number of separation after PCT | Judgement after PCT | Number of separation after HTS | Judgement after HTS |
| Example 14 | 38 | C | 0 | A | 0 | A | 35 | C |
| Example 15 | 50 | B | 0 | A | 0 | A | 16 | B |
| Example 16 | 45 | B | 4 | B | 4 | B | 45 | C |
| Example 17 | 54 | B | 0 | A | 4 | B | 19 | B |
| Example 18 | 37 | C | 0 | A | 0 | A | 12 | B |
| Example 19 | 38 | C | 0 | A | 0 | A | 13 | B |
| Example 20 | 45 | B | 0 | A | 0 | A | 5 | B |
| Example 21 | 55 | B | 0 | A | 0 | A | 6 | B |
| Example 22 | 56 | B | 0 | A | 0 | A | 0 | A |
| Example 23 | 65 | A | 0 | A | 0 | A | 0 | A |
| Example 24 | 45 | B | 0 | A | 0 | A | 0 | A |
| Example 25 | 55 | B | 0 | A | 0 | A | 0 | A |
| Comparative example 5 | 43 | B | 100 | D | — | — | — | — |
| Comparative example 6 | 3 | D | 0 | A | 10 | B | 55 | D |
| Comparative example 7 | 42 | B | 100 | D | — | — | — | — |

REFERENCE SIGNS LIST

1: silicon wafer
2: Al pad
3: passivation film
4: insulating film
5: metal film (Cr, Ti, or the like)
6: metal wiring (Al, Cu, or the like)
7: insulating film
8: barrier metal
9: scribe line
10: solder bump
11: sealing resin
12: substrate
17: metal wiring (Al, Cu, or the like)
18: electrode
19: sealing resin

The invention claimed is:

1. A resin (A) comprising:
a polyamide structure and at least one of an imide precursor structure and an imide structure, wherein
the polyamide structure is a structure of formula (1),
the imide precursor structure and the imide structure comprise at least one structure selected from the structures of formulas (2) to (5),
a diamine residue having an aliphatic group is contained in formula (1) and comprises a structural unit of formula (6), and the number average molecular weight of the structural unit of formula (6) is 150 to 2,000:

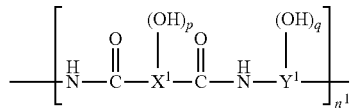
(1)

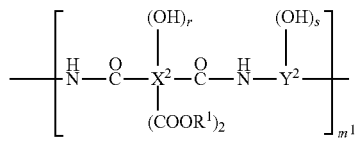
(2)

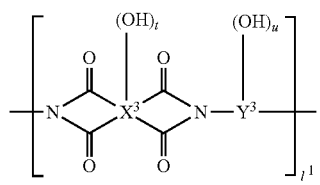
(3)

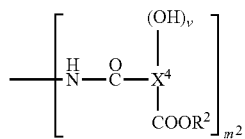
(4)

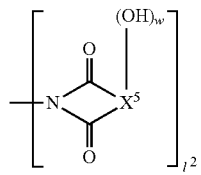
(5)

wherein in the formulas (1) to (5),
$X^1$ represents a divalent to hexavalent organic group,
$X^2$ and $X^3$ each independently represent a tetravalent to decavalent organic group,
$X^4$ represents a divalent to hexavalent organic group,
$X^5$ represents a divalent to hexavalent organic group,
$Y^1$ to $Y^3$ each independently represent a divalent to tetravalent organic group, and
$R^1$ and $R^2$ represent hydrogen or an organic group having 1 to 20 carbon atoms;
p, q, r, s, t, u, v, and w are each independently an integer number of 0 to 4;
$n^1$, $m^1$, $m^2$, $l^1$, and $l^2$ represent molar ratio of a structure of the formulas (1) to (5), such that a molar ration is within a range of $n^1:(m^1+m^2+l^1+l^2)$=98:2 to 50:50;
the formulas (1) to (5) have a sequence of structural units which may be in a block manner or in a random manner;

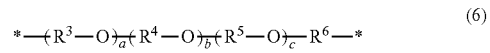
(6)

wherein in the formula (6),
$R^3$ to $R^6$ each independently represent a $C_2$-$C_{10}$ alkylene group;
* represents a chemical bond;
a, b, and c each are an integer number within a range of $1 \leq a \leq 20$, $0 \leq b \leq 20$, and $0 \leq c \leq 20$; and
the formula (6) sequence of repeating units may be in a block manner or in a random manner.

2. The resin according to claim 1, wherein
the imide precursor structure and the imide structure comprises at least one structure selected from the structures of the formulas (4) or (5), and
the content of the structural unit derived from the formula (6) is in a range of 5% to 40% by mole based on 100% by mole of structural units derived from all diamines.

3. A method for producing the resin according to claim 1, comprising the step of copolymerizing a polyamide structure obtained by polymerization at a temperature of 70° C. to 200° C. with at least any structure of the imide precursor structure and the imide structure.

* * * * *